US012456598B2

(12) United States Patent
Iwatsuka et al.

(10) Patent No.: US 12,456,598 B2
(45) Date of Patent: Oct. 28, 2025

(54) CHARGED PARTICLE BEAM APPARATUS

(71) Applicant: Hitachi High-Tech Corporation, Tokyo (JP)

(72) Inventors: Takayasu Iwatsuka, Tokyo (JP); Hideto Dohi, Tokyo (JP); Tomoyo Sasaki, Tokyo (JP); Wen Li, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 351 days.

(21) Appl. No.: 18/200,232

(22) Filed: May 22, 2023

(65) Prior Publication Data

US 2024/0014002 A1 Jan. 11, 2024

(30) Foreign Application Priority Data

Jul. 8, 2022 (JP) ................................ 2022-110340

(51) Int. Cl.
*H01J 37/24* (2006.01)
*H01J 37/14* (2006.01)
(Continued)

(52) U.S. Cl.
CPC ........ *H01J 37/244* (2013.01); *H01J 37/1475* (2013.01); *H01J 37/28* (2013.01); (Continued)

(58) Field of Classification Search
CPC ...... H01J 37/244; H01J 37/1475; H01J 37/28; H01J 2237/24455; H01J 2237/2448; H01J 2237/24521
See application file for complete search history.

(56) References Cited

U.S. PATENT DOCUMENTS 7,173,243 B1 2/2007 Yang et al.
7,847,249 B2 12/2010 Takahashi et al.
(Continued)

FOREIGN PATENT DOCUMENTS

JP 2007-200769 A 8/2007
JP 2012-26989 A 2/2012
(Continued)

OTHER PUBLICATIONS

Taiwanese Office Action received in corresponding Taiwanese Application No. 112121692 dated Apr. 24, 2024.

*Primary Examiner* — Nicole M Ippolito
(74) *Attorney, Agent, or Firm* — Mattingly & Malur, PC

(57) ABSTRACT

The charged particle beam apparatus includes a charged particle source generating a charged particle beam, a deflector deflecting the charged particle beam, a detector detecting secondary electrons emitted from an irradiation target in response to irradiation with the charged particle beam, and a processor system. The processor system (A) acquires a first time-series change in secondary electron detection-related quantity by repeatedly performing the following (A1) and (A2), (A1) directly or indirectly, maintains or changes the control amount applied to the deflector to a first control amount, and (A2) acquires the secondary electron detection-related quantity based on an output from the detector, and (B) acquires a time-series change in variation of the beam diameter of the charged particle beam based on the first time-series change.

20 Claims, 13 Drawing Sheets

(51) Int. Cl.

| | |
|---|---|
| ***H01J 37/147*** | (2006.01) |
| ***H01J 37/244*** | (2006.01) |
| ***H01J 37/28*** | (2006.01) |

(52) U.S. Cl.

CPC ................ *H01J 2237/24455* (2013.01); *H01J 2237/2448* (2013.01); *H01J 2237/24521* (2013.01)

(56) References Cited

U.S. PATENT DOCUMENTS

| | | | | |
|---|---|---|---|---|
| 8,357,897 | B2 | 1/2013 | Shishido et al. | |
| 9,230,775 | B2 | 1/2016 | Ohashi et al. | |
| 9,671,223 | B2 | 6/2017 | Shishido et al. | |
| 10,444,637 | B2 | 10/2019 | Baselmans | |
| 11,133,149 | B2 | 9/2021 | Mochizuki et al. | |
| 2004/0159787 | A1* | 8/2004 | Nakasuji | H01J 37/28 250/311 |
| 2010/0102254 | A1 | 4/2010 | Kobayashi | |
| 2018/0364563 | A1 | 12/2018 | Virdi et al. | |
| 2022/0037109 | A1 | 2/2022 | Iwatsuka et al. | |
| 2022/0208510 | A1* | 6/2022 | Janssen | H01J 37/1472 |
| 2022/0317067 | A1* | 10/2022 | Buijsse | G01N 23/20025 |

FOREIGN PATENT DOCUMENTS

| | | | |
|---|---|---|---|
| JP | 2012-234754 | A | 11/2012 |
| JP | 2022-26395 | A | 2/2022 |
| TW | 202115759 | A | 4/2021 |
| WO | 2008/117358 | A1 | 10/2008 |

* cited by examiner

LUMINANCE PROFILE OF SPECIFIC SPOT

TEMPORAL VARIATION OF MAXIMUM LUMINANCE (TEMPORAL VARIATION OF BEAM DIAMETER)

FREQUENCY SPECTRUM FOR VARIATION OF BEAM DIAMETER AFTER FFT ANALYSIS

LUMINANCE PROFILE OF SPECIFIC SPOT IN X DIRECTION

LUMINANCE PROFILE OF SPECIFIC SPOT IN Y DIRECTION

FREQUENCY SPECTRUM AT TIMING C

FREQUENCY SPECTRUM AT TIMING D

CHARGED PARTICLE BEAM APPARATUS

CROSS-REFERENCE TO RELATED APPLICATION

The present application claims priority from Japanese application JP2022-110340, filed on Jul. 8, 2022, the content of which is hereby incorporated by reference into this application.

BACKGROUND OF THE INVENTION

1. Field of the Invention

The present invention relates to a charged particle beam apparatus, and more particularly to a charged particle beam apparatus capable of measuring a variation of a beam diameter of an electron beam.

2. Description of Related Art

In recent years, a scanning electron microscope (SEM), which is one of charged particle beam apparatus, has been used to analyze a structure of a sample such as a semiconductor device. In an SEM device, the sample is irradiated and scanned with an electron beam, and secondary electrons or reflected electrons emitted from a surface of the sample are detected by a detector. The secondary electrons contain information about unevenness of the surface of the sample and a material of the sample. A photographed image (SEM image) is formed by converting a change in energy and number of the secondary electrons into luminance values for each irradiated region.

As an electrical noise measurement technique for such an SEM device, there is a technique disclosed in JP2022-26395A. JP2022-26395A discloses a technique that contributes to measurement of electrical noise by continuously irradiating a boundary between a high position of a sample and a low position of the sample with an electron beam to measure a variation of luminance and converting the measured variation of the luminance into a variation of the electron beam.

As knowledge obtained by the inventor's analysis, it was found that electrical noise may cause a variation of an electron beam diameter instead of a variation of an electron beam. Referring to JP2022-26395A, a technique of JP2022-26395A cannot acquire the variation of the electron beam diameter based on such knowledge.

Note that, since a technique disclosed in JP2012-26989A measures a variation of the beam diameter to solve the problem of JP2012-26989A that, in hardware adjustment, an instrumental difference correction method for a group of measuring SEMs in which it is difficult to eliminate the instrumental difference is provided and a method for monitoring temporal change of a critical dimension SEM unaffected by temporal change of a sample is provided, the technique cannot easily deal with high period (high frequency).

Other problems and novel features will become apparent from description of the specification and the accompanying drawings.

SUMMARY OF THE INVENTION

The brief outline of representative embodiments among embodiments disclosed in the present application is as follows.

A charged particle beam apparatus according to one embodiment includes: a charged particle source generating a charged particle beam; a deflector deflecting the charged particle beam; a detector detecting secondary electrons emitted from an irradiation target in response to the irradiation with the charged particle beam; and a processor system. The processor system (A) acquires a first time-series change in a secondary electron detection-related quantity by repeatedly performing the following (A1) and (A2), (A1) directly or indirectly maintains or changes a control amount applied to the deflector to a first control amount, and (A2) acquires the secondary electron detection-related quantity based on an output from the detector, and (B) acquires a time-series change in variation of the beam diameter of the charged particle beam based on the first time-series change.

In the above-mentioned charged particle beam apparatus, the secondary electron detection-related quantity is a secondary electron detection quantity, and the first control amount is a control amount corresponding to a position of a maximum value (including a local maximum value) of a line profile of the irradiation target.

In the above-mentioned charged particle beam apparatus, the irradiation target is a sample or a combination of the sample and a stage, the secondary electron detection-related quantity is a processed value of the output of the detector, the first control amount is a control amount when a boundary of the irradiation target is irradiated with the charged particle beam, the boundary is located between a first region and a second region of the irradiation target, the first region is a portion of the sample, and the second region is a region of the sample that has a difference in height with the first region, a region of the sample that is made of a material different from that of the first region, or a portion of the stage.

A charged particle beam apparatus according to one embodiment includes: a charged particle source generating a charged particle beam; a scanning coil deflecting the charged particle beam; a detector detecting transmitted electrons passing through an irradiation target in response to the irradiation with the charged particle beam; and a processor system. The processor system (A) acquires a first time-series change in the transmitted electron detection-related quantity by repeatedly performing the following (A1) and (A2), (A1) directly or indirectly, maintains or changes a control amount applied to the scanning coil to a first control amount, and (A2) acquires the transmission electron detection-related quantity based on an output from the detector, and (B) acquires a time-series change in variation of the beam diameter of the charged particle beam based on the first time-series change.

In the above-mentioned charged particle beam apparatus, the transmission electron detection-related quantity is a transmission electron detection quantity, and the first control amount is a control amount corresponding to a position of a maximum value (including a local maximum value) of a line profile of the irradiation target.

In the above-mentioned charged particle beam apparatus, the irradiation target is a sample or a combination of the sample and a stage, the transmission electron detection-related quantity is a processed value of the output of the detector, the first control amount is a control amount when the boundary of the irradiation target is irradiated with the charged particle beam, the boundary is located between a first region and a second region of the irradiation target, the first region is a portion of the sample, and the second region is a region of the sample that has a difference in height with the first region, a region of the sample that is made of a material different from that of the first region, or a portion of the stage.

According to one embodiment, in a charged particle beam apparatus, it is possible to obtain a variation of a beam diameter of a higher frequency electron beam.

DESCRIPTION OF EMBODIMENTS

Figure 1:
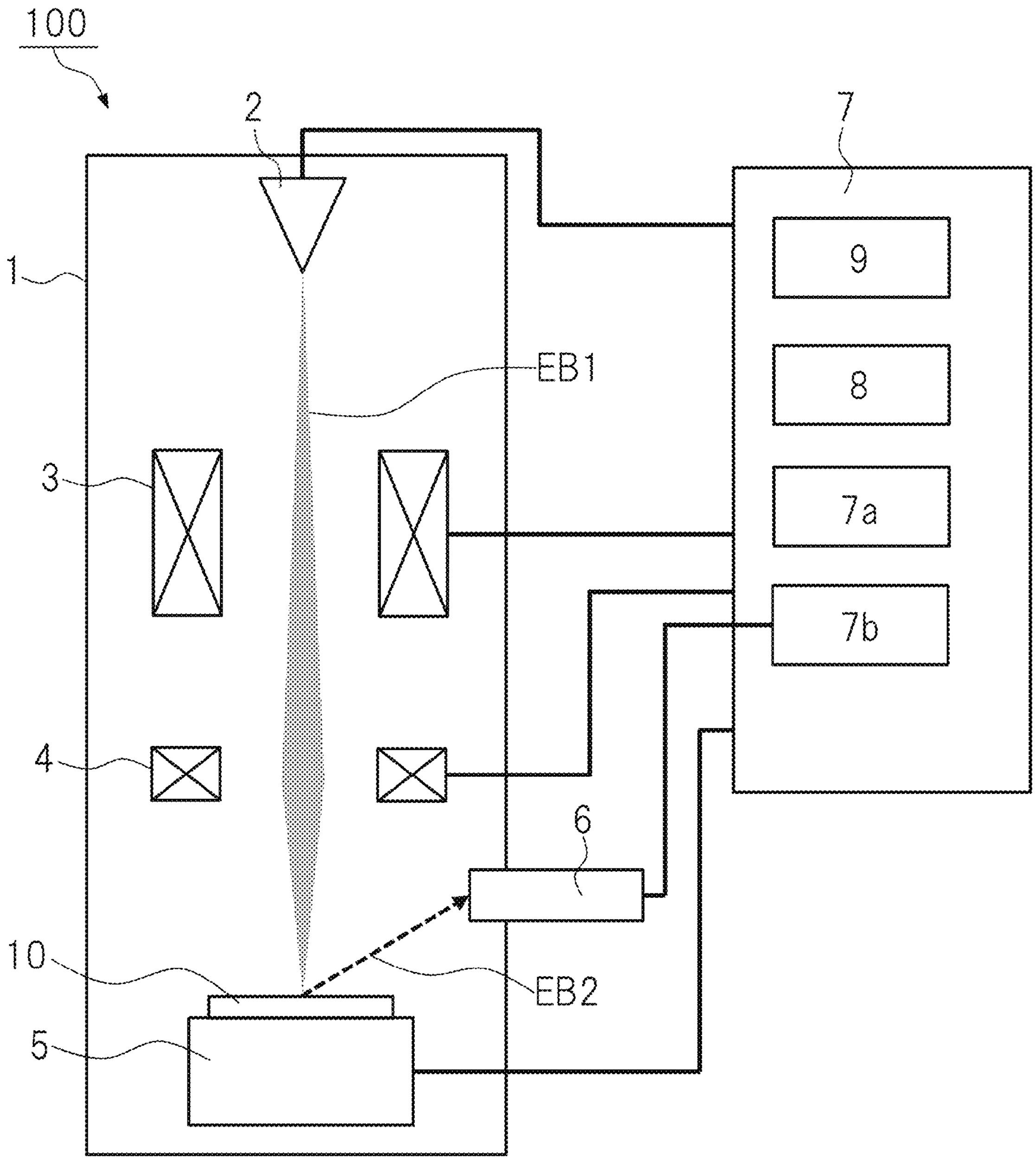
FIG. 1 is a schematic diagram illustrating a charged particle beam apparatus according to a first embodiment.

Hereinafter, embodiments will be described in detail with reference to the drawings. Note that, in all the drawings for describing the embodiments, members having the same functions will be denoted by the same reference numerals, and redundant description thereof will be omitted. In the following embodiments, the description of the same or similar parts will not be repeated in principle unless particularly necessary.

In the following embodiments, the following cases will be mainly described, but other cases are also applicable. As an example of a "charged particle beam", an electron beam having a circular (including elliptical) irradiation shape may be exemplified. As an example of an "irradiation target", a sample or a sample and a stage may be exemplified. As an example of a "secondary electron detection-related quantity", luminance may be exemplified. As an example of "acquisition of time-series change in variation of beam diameter", acquisition of time change in increase and decrease in beam diameter may be exemplified. However, acquisition of a beam diameter and a geometric length of the variation of the beam diameter is omitted.

Note that a line profile is information representing a change in secondary electron detection-related quantity on a finite-length line segment defined in the irradiation target. The change is a change in secondary electron detection-related quantity along a line segment direction. The one-line profile cannot illustrate a temporal change in secondary electron detection-related quantities on a finite line segment. The finite-length line segment is defined by a user or a program.

In the following embodiments, as a specific example of the line profile, a "luminance profile", which is a line profile in which a secondary electron detection-related quantity is luminance, will be used for description. A case where the finite-length line segment is a straight line will be described. Note that the "luminance" is a value (for example, an integer ranging from 0 to 255) associated with a pixel when displaying a graph or an image to the user. Note that, since contrast of a photographed image may be adjusted to improve user visibility, the luminance included in the photographed image or the luminance profile produced from the photographed image may be adjusted based on the luminance of other pixels.

On the other hand, in the embodiments described below, the luminance profile is not necessarily displayed on a GUI by using a display device. For example, a secondary electron detection quantity other than luminance may be displayed. The secondary electron detection quantity other than the luminance is, for example, the number of secondary electrons detected within a certain period of time, or macroscopically an amount of current detected by a detector. The secondary electron detection quantity may be expressed in a floating point format or a fixed point format other than an integer format as a data format.

Note that, in the specification, "acquisition" has the same meaning as in a dictionary, but just to be sure, acquisition occurs even when a target is produced, and the result acquisition occurs even when the acquisition is calculated or converted. Reception (input) of a target from outside an operation subject (processor system or processor) is also acquisition for the operation subject. Particularly, even when terms "production", "calculation", or "transformation" are used without explanation, such terms denote acquisition as abstract meaning.

X, Y, and Z directions described in the application are perpendicular to each other. In the application, the Z direction may be described as a vertical direction, a height direction, or a thickness direction of a structure. The expression "plan view" as used in the present application denotes viewing a plane formed by the X and Y directions from the Z direction.

First Embodiment

<Configuration of Charged Particle Beam Apparatus>

A charged particle beam apparatus 100 according to a first embodiment will be described below with reference to FIG. 1. The charged particle beam apparatus 100 described below is, for example, a scanning electron microscope (SEM device).

In recent years, a switching power source is equipped with the SEM device for power saving. Due to the switching power source, electrical noise at 100 kHz or more increases in the SEM device. Therefore, a variation of the electron beam and the variation of the beam diameter of the electron beam caused by the electrical noise are also increased to 100 kHz or more as high frequencies. Therefore, to fundamentally improve image quality by specifying noise sources and taking countermeasures, techniques for detecting the variation of the electron beam and the variation of the beam diameter of the electron beam are also required to cope with high frequencies. The charged particle beam apparatus 100 is equipped with the switching power source of 100 kHz or more.

As illustrated in FIG. 1, the charged particle beam apparatus 100 includes a sample chamber 1, an electron source (charged particle source) 2 for generating an electron beam (charged particle beam) EB1, a deflector 3, a lens 4, a stage 5 for installing a sample 10, a detector 6, and a processor system 7. The processor system 7 includes a processor **7*a*, a converter 7*b*, a recording device 8, and a display device 9. The processor system 7 is electrically connected to the electron source 2, the deflector 3, the stage 5, and the detector 6 and can control the electron source 2, the deflector 3, the stage 5, and the detector 6. Note that the electron source 2 is, for example, an electron gun. The deflector 3** is, for example, a magnetic field type deflector such as a coil with a core but may be an electric field type deflector by using electrode plates.

When observing the sample 10 that is an inspection target, the inside of the sample chamber 1 is evacuated to a high vacuum, and the sample 10 is mounted on the stage 5. The electron beam (charged particle beam) EB1 emitted from the electron source 2 is converged by the lens 4 and scanned on the desired position on the sample 10. The detector 6 is, for example, a secondary electron detector, and detects secondary electrons EB2 emitted from the sample 10 when the sample 10 is irradiated with the electron beam EB1. Note that the secondary electrons in the specification may also include backscattered electrons. The detector 6 may be, for example, an SiPM, a scintillator, a photomultiplier, or a combination thereof. Note that the output of such elements may not output the secondary electron detection quantity itself desirably by the processor system 7 or may include noise. Thus, as a portion of the detector 6, a control circuit for such elements may be included. As a portion of the detector 6, the converter **7*b*** may be included.

The secondary electrons EB2 detected by the detector 6 are sampled and signal-processed in the processor system 7. The processor system 7 analyzes the signal and can produce the photographed image (SEM image) and the luminance profile indicating a magnitude of luminance for each coordinate of the photographed image according to the amount of the secondary electrons EB2 detected by the detector 6. Various data produced by the processor system 7 are stored in the recording device 8. The processor system 7 can display the analysis results stored in the recording device 8 on the display device 9 as necessary.

The recording device 8 is a nonvolatile or volatile recording medium such as random access memory (RAM) or read only memory (ROM). The recording device 8 may be a rewritable recording medium such as a flash memory, a hard disk, a solid state drive (SSD), a universal serial bus (USB) memory or a memory card. The display device 9 is, for example, a display.

Note that, in addition to the various data generated by the processor system 7, the recording device 8 includes an analysis program for the processor **7*a* to execute. Each process performed by the processor system 7 is realized by the processor 7*a* reading the analysis program from the recording device 8**.

The processor **7*a* is an arithmetic device that reads various programs stored in the recording device 8 and executes processes corresponding to each program. Note that the processor 7*a*** is a microprocessor, a central processing unit (CPU), a graphics processing unit (GPU), a field programmable gate array (FPGA), a quantum processor, or a semiconductor device capable of performing an arithmetic process.

The converter **7*b* is a device that converts an analog signal from the detector 6 into a digital signal and is, for example, an A/D converter. The converter 7*b*** may be provided with a function of performing a pre-process such as image contrast adjustment or noise removal after digitizing the analog signal.

<Measurement of Variation in Beam Diameter of Electron Beam>

The processor system in the first embodiment performs the following operations (A) and (B).

(A) Acquire a first time-series change in secondary electron detection-related quantity by repeatedly performing the following (A1) and (A2).

(A1) Directly or indirectly, maintain or change a control amount applied to the deflector 3 to a first control amount.

(A2) Acquire the secondary electron detection-related quantity based on an output from the detector 6.

(B) Acquire the time-series change in variation of the beam diameter of the charged particle beam (electron beam EB1) based on the first time-series change.

More specifically, the processor system 7 can calculate the time-series change in maximum luminance in the luminance profile and can calculate the frequency spectrum related to the variation of the maximum luminance based on the time-series change. Then, the frequency spectrum related to the variation of the maximum luminance can be considered to be the frequency spectrum related to the variation of the beam diameter of the electron beam EB1. Therefore, from the frequencies included in the frequency spectrum, the frequency causing the variation of the beam diameter can be specified. Such functions will be described below with reference to FIGS. 2 to 9.

Figure 2:
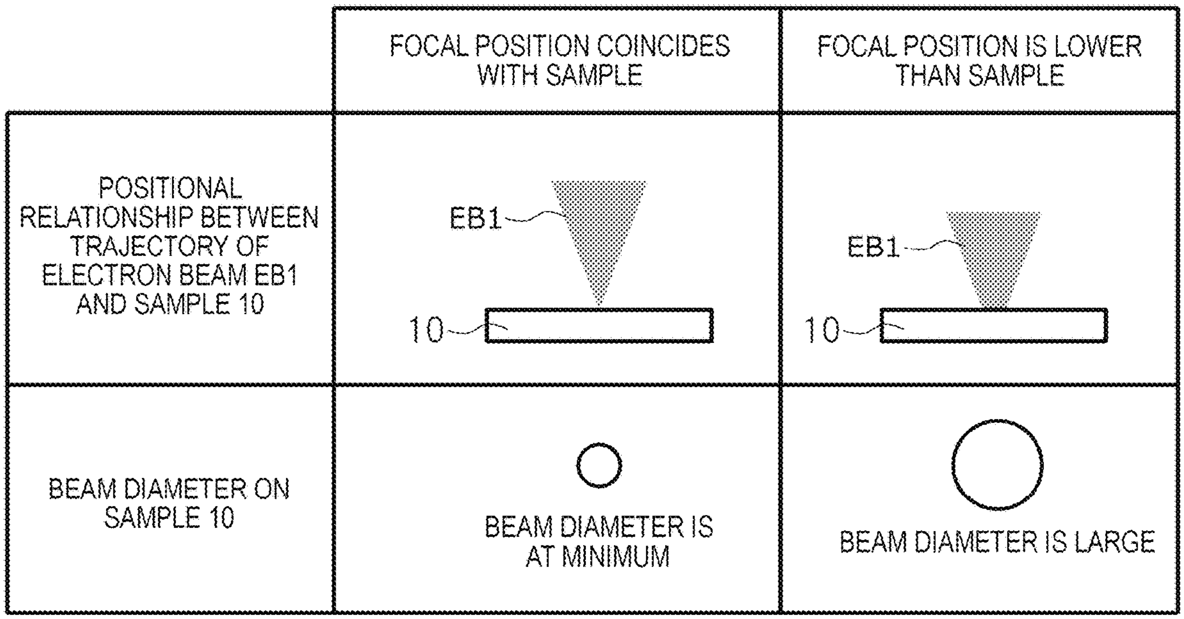
FIG. 2 is a schematic diagram illustrating a variation in beam diameter of an electron beam according to the first embodiment.

FIG. 2 is a schematic diagram illustrating that the beam diameter of the electron beam EB1 varies on the sample 10.

As the beam diameter on the sample 10 is smaller, the finer structure can be imaged, so that resolution is improved. For that purpose, it is preferable that a focal position of the electron beam EB1 just coincides with the surface of the sample 10. However, when the focal position becomes lower or higher than the sample 10 due to reasons such as poor control of the lens 4 for converging the electron beam EB1, the beam diameter on the sample 10 increases, and the resolution decreases.

In recent years, in particular, the charged particle beam apparatus 100 is equipped with the switching power source of 100 kHz or more to save power. When high-frequency electrical noise of 100 kHz or more is superimposed on the lens 4, an uncontrollable high-frequency variation of the beam diameter may occur, and thus, there is a concern that the resolution decreases.

Note that defocusing denotes that the focal position of the electron beam EB1 varies up and down from the sample 10, but in general, a variation of the beam diameter are caused by factors other than defocusing. The method of the present application is not limited to the variation of the beam diameter due to defocusing, and a general variation of the beam diameter can be measured.

Figure 3:
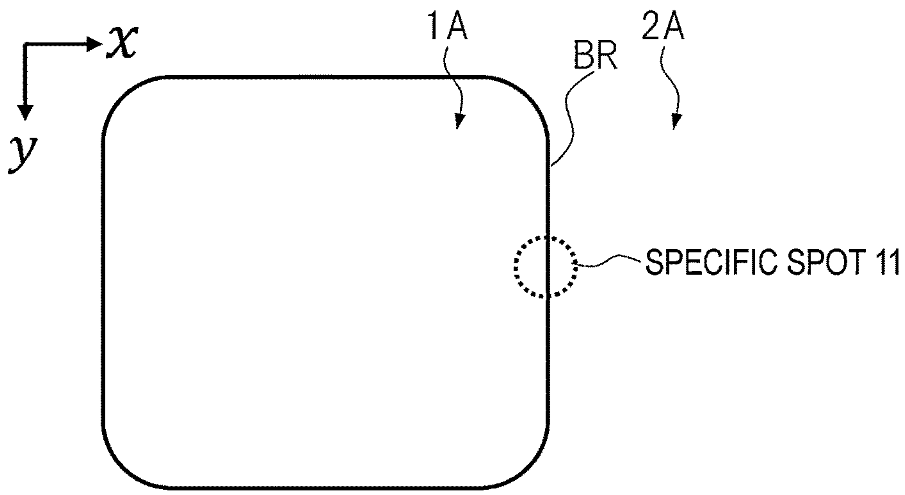
FIG. 3 is a plan view illustrating a specific spot in the first embodiment.

FIG. 3 is a plan view illustrating an imaging target. A specific spot 11 in FIG. 3 is a spot where imaging is actually performed. The specific spot 11 includes a region 1A, a region 2A adjacent to the region 1A, and a boundary BR between the regions 1A and 2A. The region 1A is a portion of the sample 10. The region 2A is a region of the sample 10 in which a difference in height from the region 1A occurs.

Figure 4:
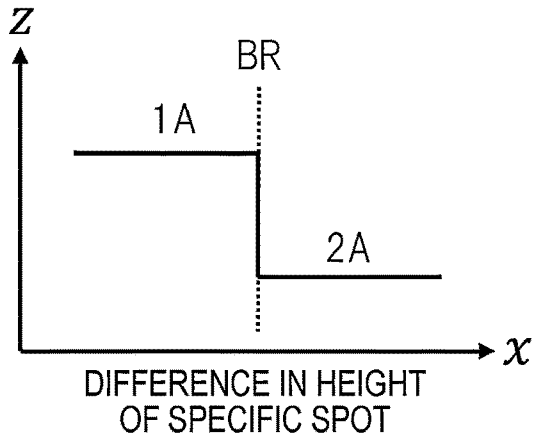
FIG. 4 is a graph illustrating an example of the specific spot.
Figure 5:
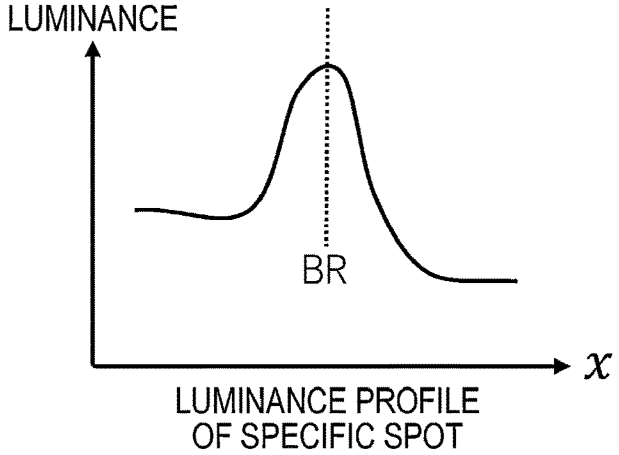
FIG. 5 is a luminance profile illustrating a magnitude of luminance for each coordinate of a photographed image of the specific spot.

FIG. 4 illustrates the difference in height of such a specific spot 11. FIG. 5 is a luminance profile when the specific spot 11 is irradiated with the electron beam EB1 from the electron source 2. It is known that when there is a difference in height, the luminance of the photographed image imaged by scanning with the electron beam EB1 becomes extremely high at the boundary BR. This is because the secondary electrons EB2 generated by the electron beam EB1 are emitted from the side surface of the sample 10 in addition to the upper surface of the sample 10.

That is, the boundary BR corresponds to the maximum luminance (or the position on the X coordinate having the maximum luminance) in the luminance profile illustrated in FIG. 5. In the first embodiment, the maximum luminance is used to specify the cause of the variation of the beam diameter. Note that the luminance profile is information indicating a change in luminance on a designated region (typically, a finite-length straight line specified by the user) and is a two-dimensional graph. Typically, the horizontal axis is coordinates (positions) on the finite-length straight line, and the vertical axis is luminance at the position. Note that, in the following description, the maximum luminance may indicate the luminance value itself or may indicate the position on the X coordinate having the maximum luminance. Note that, in some cases, the region having the maximum value on the luminance profile as a graph is called a maximum value region.

Note that no reference is made to an actual geometrical distance or length on the sample 10 to obtain the coordinates of the horizontal axis when producing the luminance profile. Instead, the electron beam EB1 of the SEM device is generated, and the coordinates of the horizontal axis are obtained based on the control amount of the components related to leading up to the sample 10. The example of the control amount is a control amount related to a deflection amount instructed to the deflector 3 by the processor system. Note that the relationship between the control amount and the actual deflection amount of the electron beam EB1 need not be linear. Note that the variation of the beam, which is a target of the second embodiment, is not a component of the control amount. Therefore, the position shifted from the past irradiation position on the sample due to the influence of the variation of the beam may be irradiated with the electron beam EB1. Therefore, the luminance on the same coordinates of the luminance profile at different times changes.

Note that, when the deflector 3 is a magnetic field type deflector, the control amount is an amount of current applied to the deflector or an input signal value applied to a current supply circuit (which outputs a current corresponding to an input signal) located in a front stage of the deflector. When the deflector 3 is an electric field type deflector, the control amount is an amount of voltage applied to the deflector or an input signal value applied to a voltage supply circuit (which outputs a voltage corresponding to an input signal) located in a front stage of the deflector. In any case, the processor system 7 directly or indirectly applies the control amount to the deflector, so that the processor system 7 controls a deflection amount of the electron beam EB1 by the deflector.

Note that the region 2A is not limited to a region having a difference in height, and may have a configuration that obtains sufficiently high luminance at the boundary BR. For example, the region 2A may be a region of the sample 10 made of a material different from that of the region 1A or may be a region outside the sample 10 like a portion of the stage 5.

Figure 6:
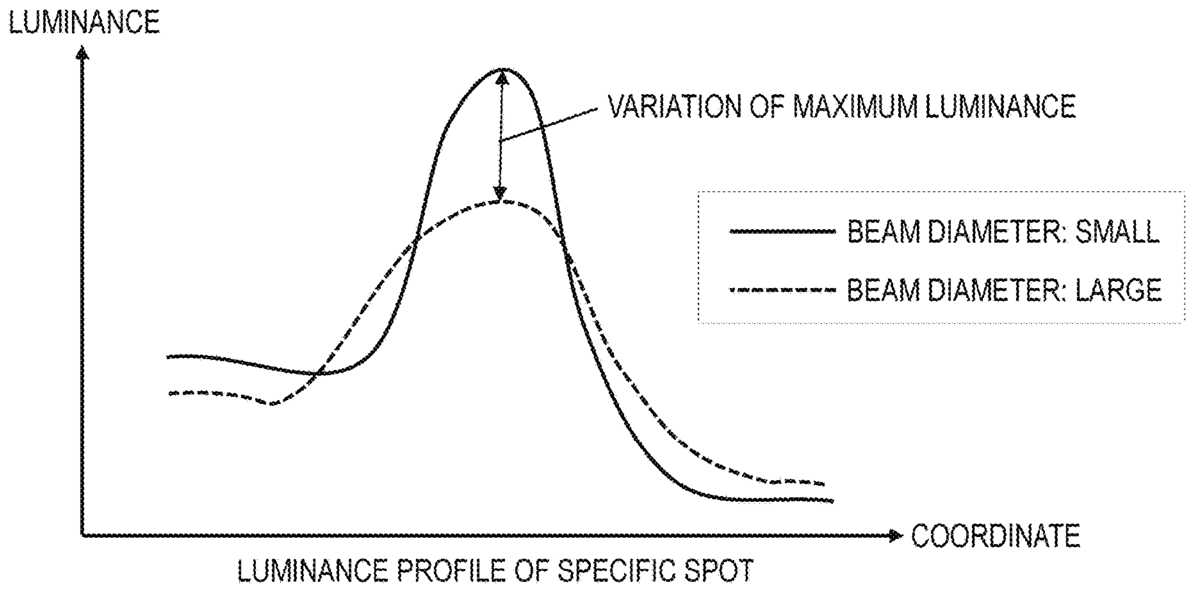
FIG. 6 is a luminance profile illustrating a magnitude of luminance for each coordinate of a photographed image of the specific spot.

FIG. 6 is a luminance profile illustrating a measurement principle of a variation of the beam diameter. FIG. 6 illustrates luminance profiles for a large beam diameter and a small beam diameter. When the beam diameter is small, the luminance profile will be sharp, but when the beam diameter is large, the luminance profile will be gentle.

Herein, focusing on the maximum luminance in the luminance profile, it can be seen that the variation of the beam diameter appears as a difference in luminance. This is because, as illustrated in FIG. 4, when the beam diameter increases, the amount of the electron beam EB1 with which the boundary BR is irradiated becomes thinner than when the beam diameter is small. That is, the variation of the beam diameter can be measured by measuring the variation of the luminance.

Note that the maximum luminance is less influenced by beam variation. The reason will be explained by using FIG. 4 as an example. Since the primary beam EB1 is circularly irradiated, the center of the primary beam EB1 when obtaining the maximum luminance is located at the boundary BR. Suppose that the primary beam EB1 slightly fluctuates in the X direction after that state. However, when the amount of variation is very small, the relationship between the length of the boundary BR1 irradiated with the circular beam EB1 (as a physical phenomenon, the area is more accurate) becomes a change in an order smaller than the amount of variation. Therefore, the amount of decrease in luminance profile is also an order smaller than the amount of variation. The fact denotes that, even when the intensity distribution of the electron beam EB1 is a Gaussian distribution or a Poisson distribution with the maximum value at a center of a circle (irradiation center), the region around the center of the circle can be considered to have an approximately uniform distribution, so that the region around the center of the circle has a similar influence relationship. Therefore, by focusing on the variation of the maximum luminance of the luminance profile, the variation of the beam diameter can be separated from the variation of the beam and can be measured.

Figure 7:
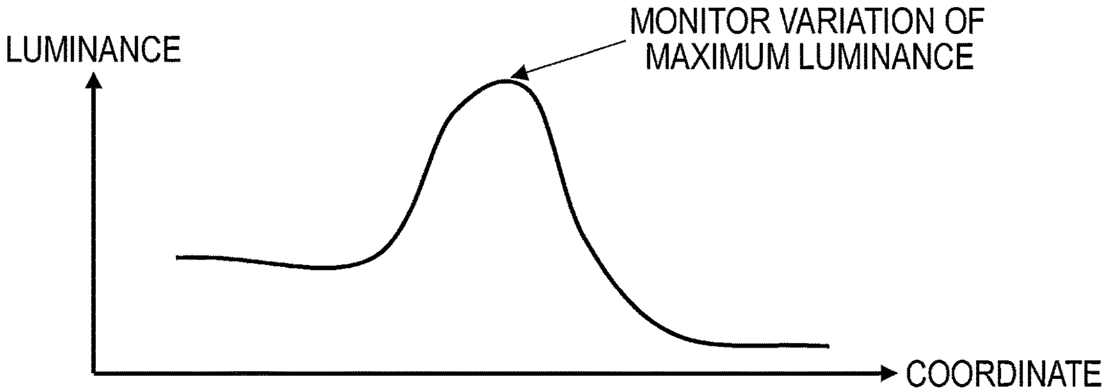
FIG. 7 is a luminance profile illustrating a magnitude of luminance for each coordinate of a photographed image of the specific spot.
Figure 8:
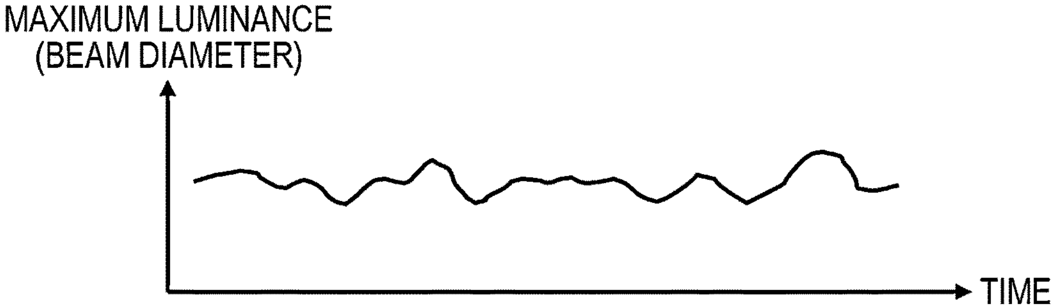
FIG. 8 is a graph illustrating a time-series change in luminance according to the first embodiment.

The technique for measuring the variation of the beam diameter will be specifically described below with reference to FIGS. 7 to 9. Note that in the following description, the processor system 7 is an execution subject of the method unless otherwise specified.

First, the sample 10 is mounted on the stage 5. Next, the specific spot 11 on the stage 5 is irradiated with the electron beam EB1 from the electron source 2 continuously or repeatedly. Herein, the processor system 7 repeatedly produces the luminance profile illustrated in FIG. 7 and measures the variation of the maximum luminance in the luminance profile one by one. Accordingly, the processor system 7 calculates the time-series change in maximum luminance illustrated in FIG. 8. The time-series change in maximum luminance can be considered to be the time-series change in beam diameter of the electron beam EB1.

Note that, in the specification, the case will be described in which the scanning pattern of the electron beam EB1 is a finite-length straight line to produce the luminance profile without producing the photographed image. However, the photographed image may be produced, and the luminance profile may be produced from the photographed image. In the latter case, the specific spot 11 is a portion of the photographed image, so that the irradiation of the specific spot 11 with the electron beam EB1 is not continuous but continuous or repeated. Note that, in the former case, the specific spot 11 is a finite-length straight line (more precisely, a finite-length straight line having a width corresponding to the beam diameter of the electron beam EB1).

Note that, in the former case (luminance profile generation in which photographed image production is omitted), a luminance profile production process by the processor system 7 changes the control amount applied to the deflector 3 to perform the following (1) and (2) from time to time while following the start point to the end point of the finite-length straight line.

(1) Determine the X-coordinate position of the luminance profile from the control amount applied to the deflector 3.

(2) Acquire the luminance obtained according to the control amount of (1) above mentioned.

When the luminance profile is repeatedly acquired, after the control amount corresponds to the end point, the control amount may be returned to the control amount corresponding to the start point.

Note that a process of specifying the position of the maximum luminance from the luminance profile herein is the following "position determination method 1" and "position determination method 2".

In the "position determination method 1", the position on the X coordinate of the maximum luminance determined in the first luminance profile is used as the position of each subsequent luminance profile. Note that the position determination in the first luminance profile may be designated by the user or may be determined by the processor system 7 based on a predetermined standard. For example, the position determination in the first luminance profile is determined based on a maximum value or a derivative value.

In the "position determination method 2", the "position determination method 1" described for the first luminance profile is also used for position determination with subsequent luminance profiles.

Figure 9:
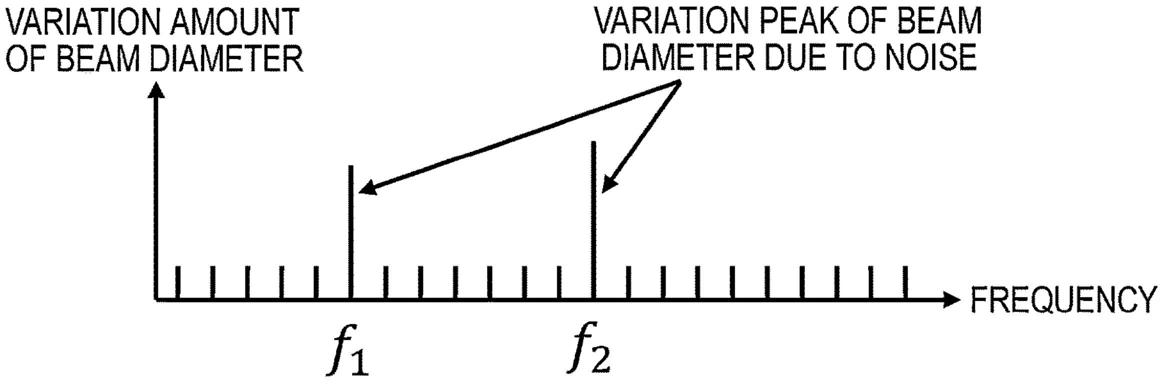
FIG. 9 is a graph illustrating a frequency spectrum of the variation of the beam diameter of the electron beam.

Next, by using frequency analysis such as fast Fourier transform (FFT), the processor system 7 calculates the frequency spectrum related to the variation of the maximum luminance illustrated in FIG. 9 based on the time-series change in maximum luminance. The frequency spectrum can be considered to be the frequency spectrum related to the variation of the beam diameter of the electron beam EB1.

By referring to the frequency spectrum in FIG. 9, it can be understood at what frequency the variation of the beam diameter mainly occurs. Herein, it can be specified that a frequency f1 and a frequency f2 are the causes of the variation of the beam diameter.

In general, the frequencies of the variation of the beam and the variation of the beam diameter and the frequency of the noise causing the variation of the beam and the variation of the beam diameter are the same. Therefore, when the frequency of the large peak included in a frequency spectrum related to the variation of the beam diameter is recorded, the noise source emitting the same frequency can be found, and countermeasures can be taken against the noise source, that a fundamental solution to the variation of the beam diameter is possible.

Since the process such as SEM simulation as in JP2012-26989A is not required, even higher frequency spectra can be handled. In particular, when the luminance profile or the line profile is produced without producing the photographed image, the scanning range of the electron beam EB1 can be greatly reduced, so that it is possible to cope with higher frequencies. Note that the advantages of the high-frequency response can also be said for the embodiments described later.

As described above, according to the first embodiment, even when the charged particle beam apparatus 100 is equipped with a switching power source of 100 kHz or more, the variation of the beam diameter of the electron beam EB1 can be measured from the variation of the maximum luminance in the charged particle beam apparatus 100, so that a noise source causing the variation of the beam diameter can be specified.

Second Embodiment

A charged particle beam apparatus 100 according to a second embodiment will be described below with reference to FIG. 10. Note that, in the following description, differences from the first embodiment will be mainly described, and descriptions of configurations that overlap with the first embodiment will be omitted.

In the second embodiment, when the variation of the beam, a variation of the beam diameter, and the noise in the detection system exist at the same time, a method of separating and measuring the variation of the beam, the variation of the beam diameter, and the noise in the detection system will be described.

Note that the noise in the detection system is noise that influences any component of the detector 6 and the processor system 7, and is noise that is detected even when there is not irradiation with the electron beam EB1.

Figure 10:
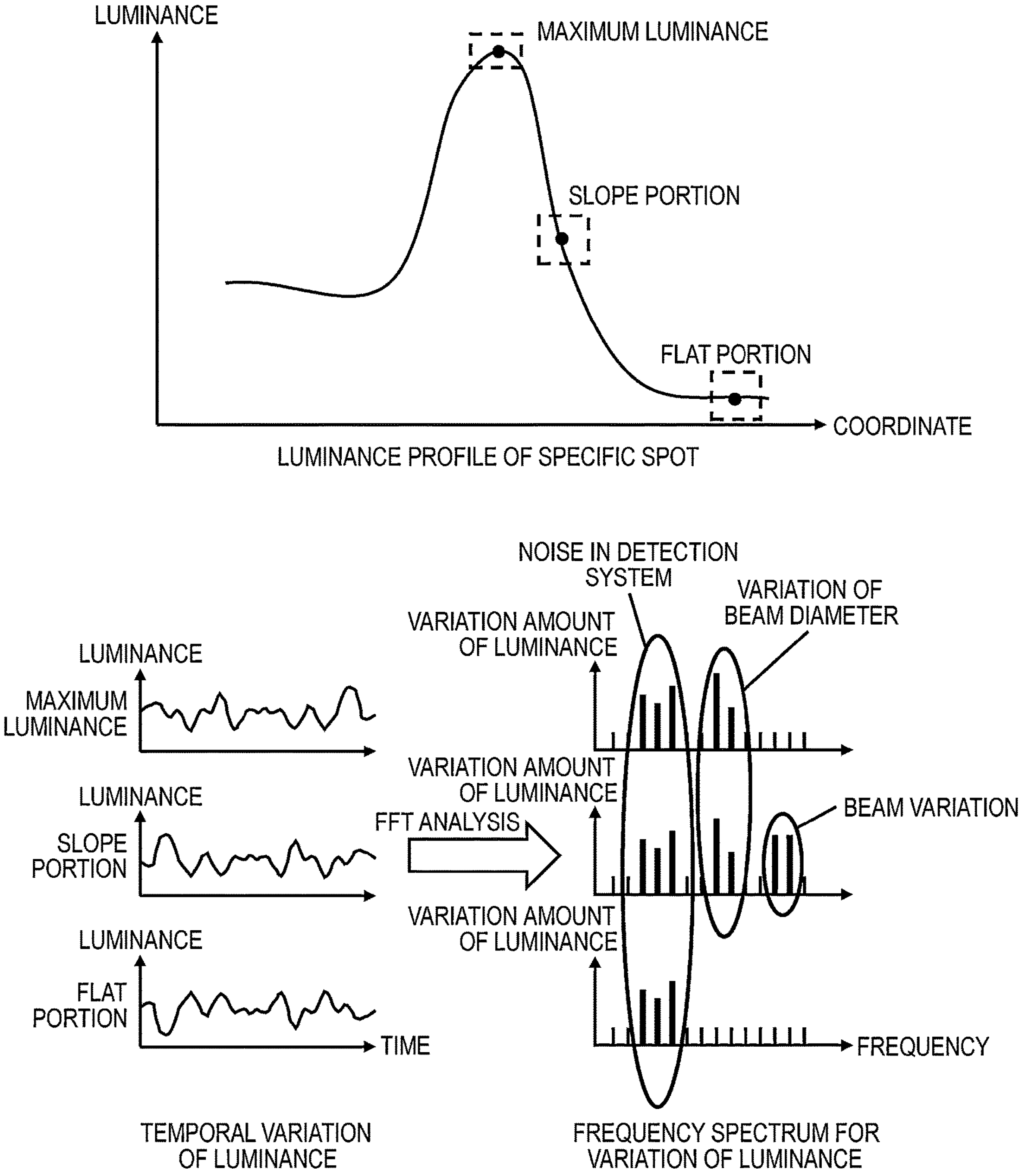
FIG. 10 is a luminance profile illustrating a magnitude of luminance for each coordinate of a photographed image of a specific spot, a graph illustrating a time-series change in luminance, and a graph illustrating a frequency spectrum of a variation of luminance according to a second embodiment.

In the second embodiment, the variation of the luminance are calculated for positions other than the maximum luminance in the luminance profile illustrated in FIG. 10. As illustrated in FIG. 10, the luminance profile includes a maximum luminance, a flat spot representing constant luminance, and a gradient spot located between the maximum luminance and the flat spot, where the luminance changes continuously.

Referring to FIG. 3, the flat spot is a portion of the region 1A or the region 2A where there is almost no change in luminance within a certain range and corresponds to a surface of the stage 5 or a spot of the sample 10 where there is no change in a structural pattern. By using FIG. 4 as an example, when the flat spot appears, as the boundary BR is irradiated with the electron beam EB1, the electron beam EB1 is far from the boundary BR. The gradient spot is a portion of the region 1A or the region 2A where the luminance continuously changes, and corresponds to a spot of the sample 10 where the structural pattern changes.

By using FIG. 4 as an example, when the gradient spot appears, the distance between the circle center of the electron beam EB1 and the boundary BR is close to the beam radius. From the case where the distance is equal to the beam radius, as the distance is gradually shortened, the increment of the length of the boundary BR increases by an order larger than the increment of the distance between the circle center and the boundary BR. When the intensity distribution of the electron beam EB1 is the above-mentioned Gaussian or Poisson distribution described above, the relationship is gentle but still the same. Therefore, when the electron beam EB1 fluctuates in the X direction, the luminance is likely to change. Note that it can be said that the gradient spot occurs when the positional relationship between the boundary BR and the electron beam EB1 is highly sensitive.

Note that, although the example of the processing by the processor system 7 for determining the position of the maximum luminance is illustrated in the first embodiment, but similar processing is used to determine the positions of the gradient spot and the flat spot on the X coordinate. Note that it is not necessary to uniformly apply the above-described "position determination method 1" or "position determination method 2" to the maximum luminance, the gradient spot, and the flat spot, and such methods may be used separately. For example, the position determination method 2 may be performed at the maximum luminance, the position determination method 1 may be performed at the gradient spot, and the position determination method 2 may be performed at the flat spot.

The description will be made by returning to FIG. 10. First, similarly to the first embodiment, the processor system 7 calculates the first time-series change in maximum luminance and calculates a first frequency spectrum related to the variation of the maximum luminance based on the first time-series change by using a fast Fourier transform (FFT) or the like. Herein, since the variation of the beam does not contribute to the variation of the maximum luminance at all, the variation of the maximum luminance is caused by the variation of the beam diameter and the noise in the detection system.

Next, the processor system 7 calculates a second time-series change in luminance at the flat spot and calculates a second frequency spectrum related to the variation of luminance at the flat spot based on the second time-series change by using the fast Fourier transform (FFT) or the like. At the flat spot, the variation of the beam and the variation of the beam diameter do not contribute to the variation of the luminance at all, but noise in the detection system is detected regardless of the sample 10, so that the variation of the luminance are caused only by the noise in the detection system.

Next, the processor system 7 calculates a third time-series change in luminance at the gradient spot and calculates the third frequency spectrum related to the variation of the luminance at the gradient spot based on the third time-series change by using the fast Fourier transform (FFT) or the like. The variation of the luminance at the gradient spot is caused by all of the variation of the beam, the variation of the beam diameter, and the noise in the detection system.

By comparing the first, second, and third frequency spectra, the frequencies causing beam variation, the frequencies causing the variation of the beam diameter, and the frequencies caused by noise in the detection system can be specified.

That is, frequencies common to the first, second and third frequency spectra include frequencies caused by the noise in the detection system. Frequencies common to the first and third frequency spectra include frequencies causing the variation of the beam diameter of the electron beam EB1. Frequencies existing only in the third frequency spectrum include frequencies causing the variation of the beam of the electron beam EB1. Then, similarly to the first embodiment, it is sufficient to search for the noise source emitting frequencies matching with the frequencies and to take countermeasures against the noise source.

As described above, according to the second embodiment, even when the variation of the beam, the variation of the beam diameter, and the noise in the detection system exist at the same time, the noise sources causing each of the variation of the beam, the variation of the beam diameter, and the noise in the detection system can be specified. Note that the specifying of the common frequency may be performed by the processor system 7 or may be performed by the user who has confirmed the display of each spectrum.

Third Embodiment

A charged particle beam apparatus 100 according to a third embodiment will be described below with reference to FIGS. 11 to 14. Note that, in the following description, differences from the first embodiment will be mainly described, and descriptions of configurations that overlap with the first embodiment will be omitted.

Figure 11:
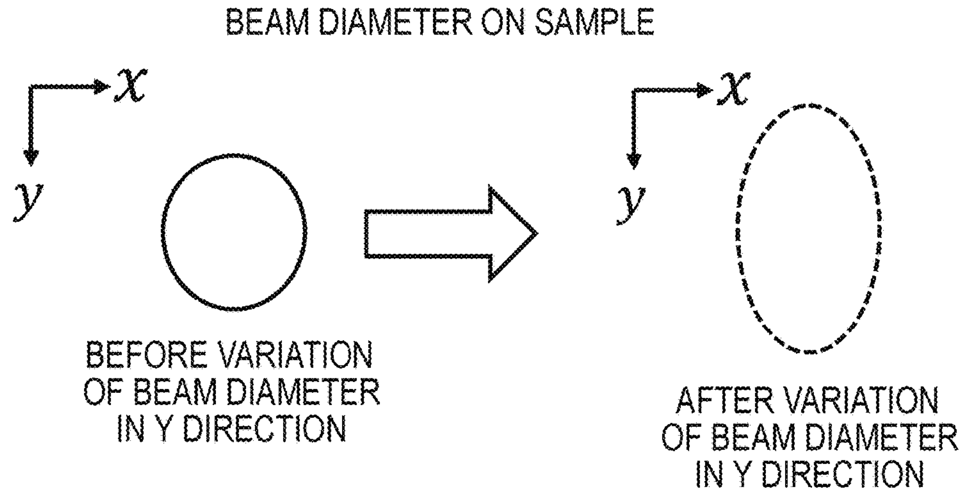
FIG. 11 is a plan view illustrating a variation of a beam diameter of an electron beam according to a third embodiment.

The third embodiment will explain a method of measuring not only the variation of the beam diameter in one direction but also the variation of the beam diameter in other directions. Depending on an optical component through which noise propagates, it is conceivable that an amount of the variation of the beam diameter may differ depending on the direction. Therefore, as illustrated in FIG. 11, for example, a case is considered in which a beam diameter in the X direction does not fluctuate and only a beam diameter in the Y direction fluctuates due to noise.

Figure 12:
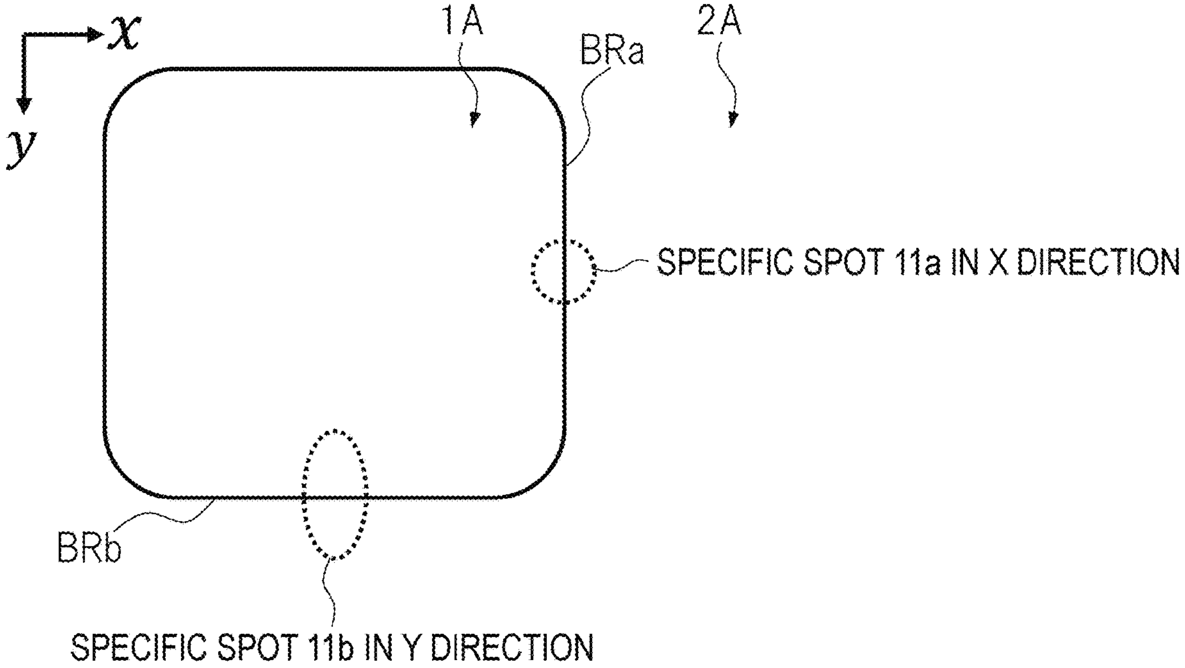
FIG. 12 is a plan view illustrating a specific spot in the third embodiment.

As illustrated in FIG. 12, a boundary BR includes a boundary BRa extending in the Y direction and a boundary BRb extending in a direction different from the Y direction (herein, the X direction). In the first embodiment, measurement is performed for a specific spot 11*a* in the X direction to include the boundary BRa. In the third embodiment, measurement is also performed for a specific spot 11*b* in the Y direction to include the boundary BRb. That is, in the third embodiment, by using the same technique as in the first embodiment, a processor system 7 calculates a frequency spectrum of the boundary BRa and, after that, calculates a frequency spectrum of the boundary BRb.

Figure 13:
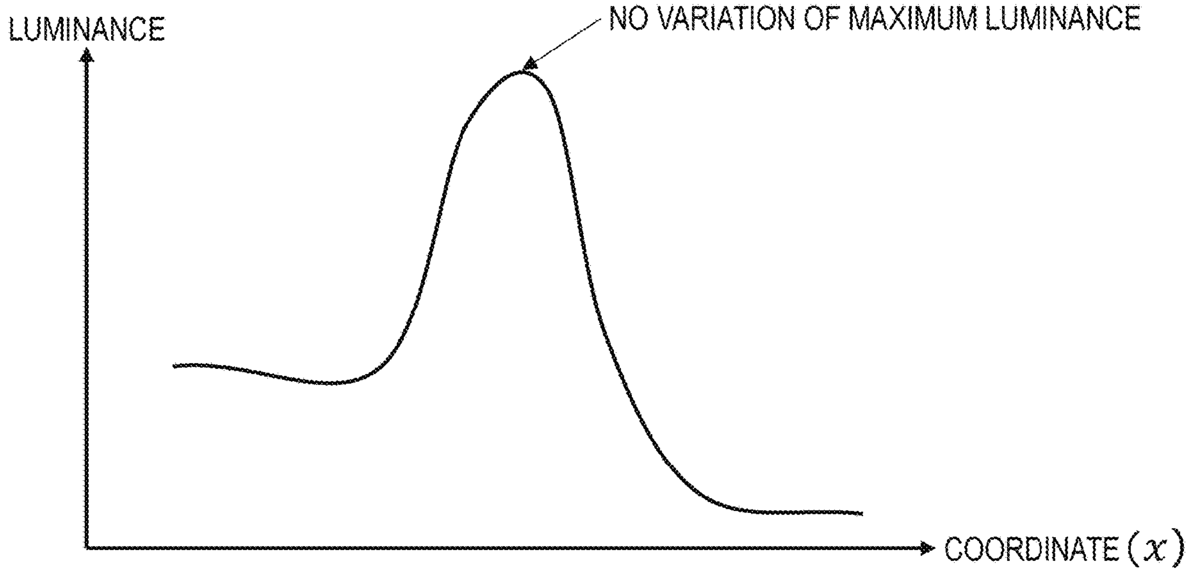
FIG. 13 is a luminance profile illustrating a magnitude of luminance for each coordinate of a photographed image of the specific spot in the third embodiment.
Figure 14:
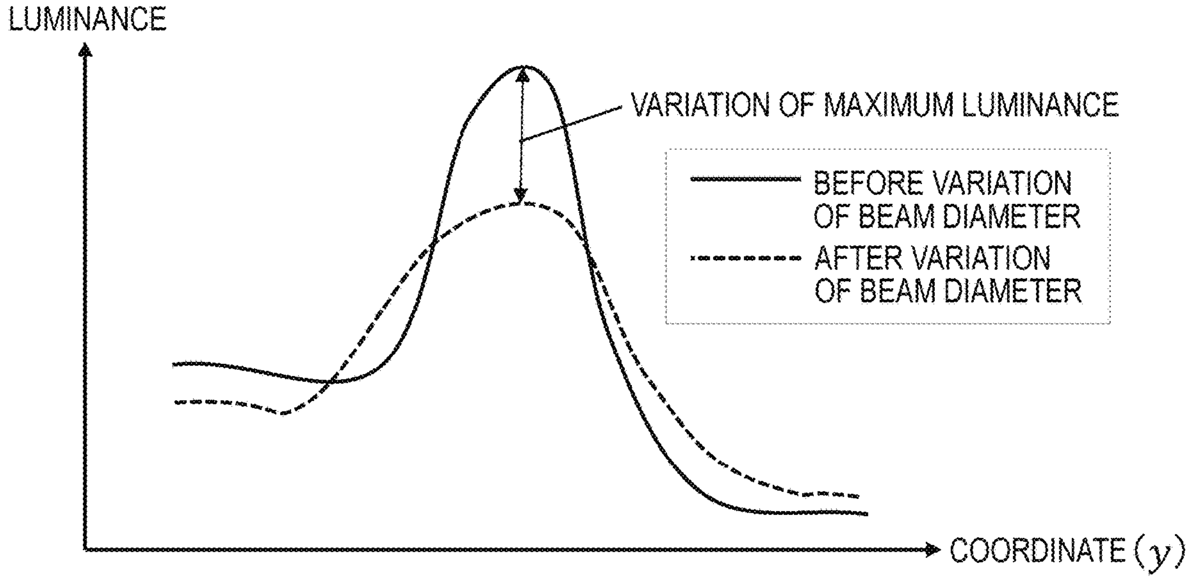
FIG. 14 is a luminance profile illustrating a magnitude of luminance for each coordinate of a photographed image of the specific spot in the third embodiment.

As illustrated in FIG. 13, it can be determined that there is no variation of the beam diameter in a case where there is no variation of the maximum luminance when the measurement is performed at the specific spot 11*a* in the X direction. On the other hand, as illustrated in FIG. 14, it can be determined that there is a variation of the beam diameter in a case where there is a variation of the maximum luminance when measurement is performed at the specific spot 11*b* in the Y direction.

As such, by sequentially measuring the boundaries BR extending in different directions, it is possible to specify in which direction the beam diameter is influenced by noise. In the third embodiment, the X direction and the Y direction have been described as examples, but similar effects can be obtained in other directions as well. For example, it is also possible to measure in all directions of 360 degrees by using the sample 10 having a circular pattern.

Note that the technique disclosed in the third embodiment can also be implemented in combination with the technique disclosed in the second embodiment.

Fourth Embodiment

A charged particle beam apparatus 100 according to a fourth embodiment will be described below with reference to FIGS. 15A to 15D. Note that, in the following description, differences from the first embodiment will be mainly described, and descriptions of configurations that overlap with the first embodiment will be omitted.

In the fourth embodiment, a method of calculating a variation of the beam diameter of the electron beam EB1 for each certain period and monitoring environmental change and deterioration over time inside and outside the device will be described.

Figure 15A:
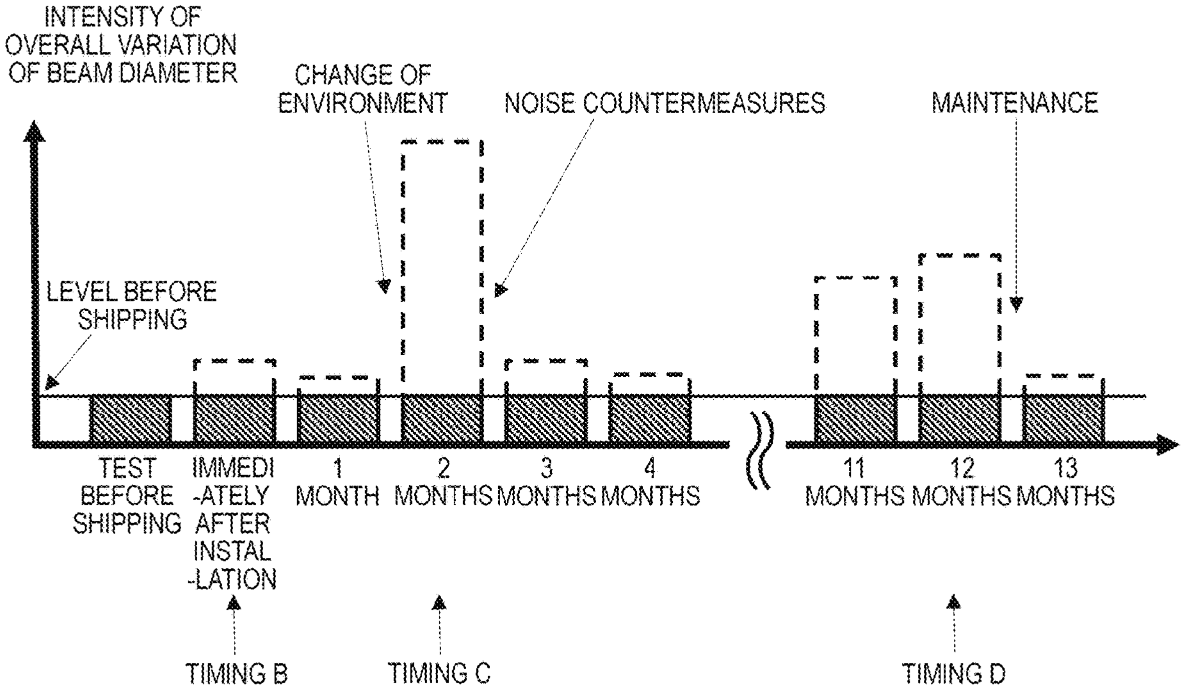
FIG. 15A is a schematic diagram illustrating monitoring of increase and decrease in a variation of a beam diameter of an electron beam due to environmental change and deterioration over time in a fourth embodiment.
Figure 15B:
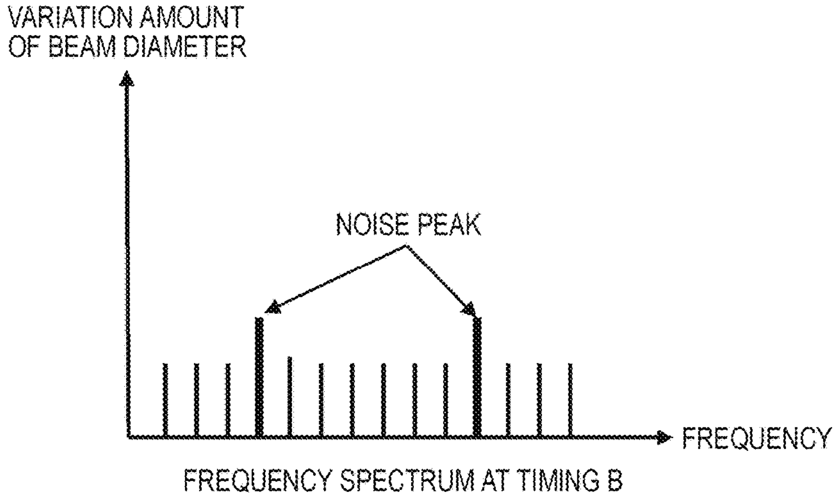
FIG. 15B is a graph illustrating a frequency spectrum of the variation of the beam diameter of the electron beam.
Figure 15C:
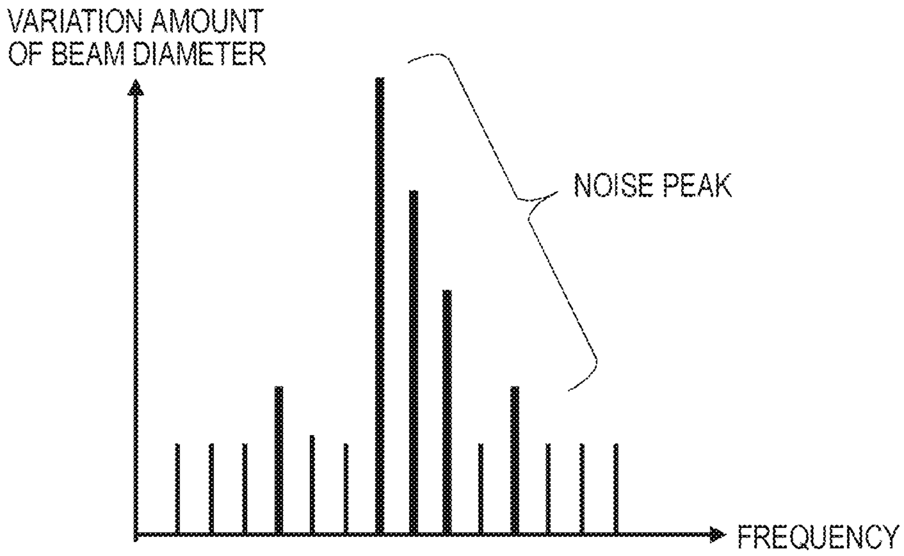
FIG. 15C is a graph illustrating a frequency spectrum of the variation of the beam diameter of the electron beam.
Figure 15D:
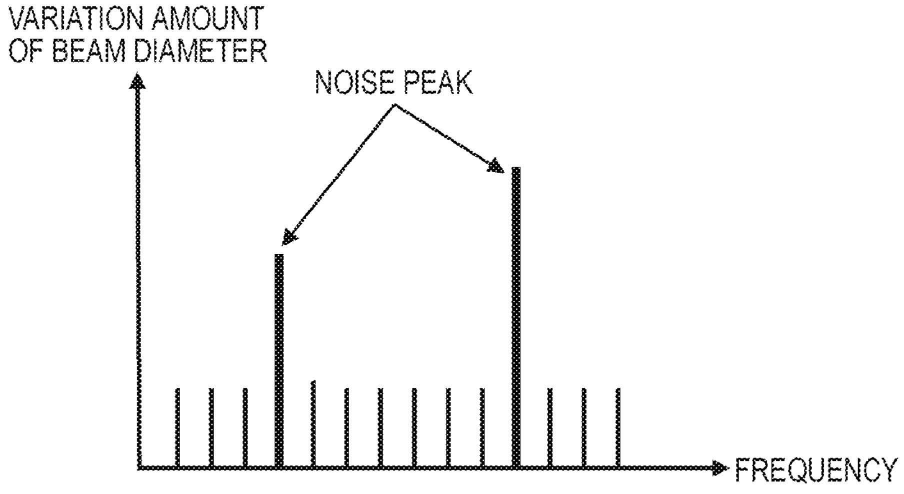
FIG. 15D is a graph illustrating a frequency spectrum of the variation of the beam diameter of the electron beam.

Note that the frequency spectra at the measurement timings B to D illustrated in FIG. 15A correspond to FIGS. 15B to 15D, respectively.

First, before shipping the charged particle beam apparatus 100, the variation of the beam diameter is measured, and the frequency spectrum is recorded. It is considered that the resolution deteriorates as the variation of the beam diameter increases. Therefore, as an index of resolution degradation, for example, a square root of sum of squares is used for all peak values in a frequency spectrum related to the variation of the beam diameter, so that the intensity of the overall variations of the beam diameter is defined. The intensity of the overall variations of the beam diameter before shipment is calculated and recorded in the recording device 8.

Next, after the charged particle beam apparatus 100 is installed, the variation of the beam diameter is measured, for example, for each month, and each time the intensity of the variation of the beam diameter is calculated and stored in the recording device 8 together with the frequency spectrum.

By plotting the intensity of the variation of the beam diameter with respect to the timing of each measurement, it is possible to quantitatively grasp the influence of the variation of the beam diameter due to the environmental change and deterioration over time inside and outside the device on a degradation in resolution.

The dashed line illustrated in FIG. 15A represents the intensity of the variation of the beam diameter at each measurement timing. The hatched region represents the intensity of the variation of the beam diameter before shipment. In the example, after the charged particle beam apparatus 100 is installed, the large change of the surrounding environment occurs between the first month and the second month, and thus, the variation of the beam diameter increases significantly and exceeds a preset anomaly detection level.

After that, noise countermeasures are performed, and the variation of the beam diameter settles down to the original level after 3 months. After that, the noise measurement is performed every month, maintenance is performed after measurement in the 12th month is completed, and the variation of the beam diameter, which had increased due to deterioration over time, settles down to the level immediately after installation in the 13th month.

FIGS. 15B to 15D illustrate measurement results of electrical noise immediately after installation of the charged particle beam apparatus 100 and two months after installation of the device and 12 months after installation of the device, respectively, and the thick line in the frequency spectrum represents a noise peak.

The intensity of the variation of the beam diameter in FIG. 15A is calculated by using the peak values of such a frequency spectrum. While no noise peaks are found in FIG. 15B, the number and value of noise peaks are increased in FIGS. 15C and 15D. By referring to FIG. 15A, the customer can predict that the resolution has deteriorated before imaging the sample 10, so that noise countermeasures can be taken quickly.

Maintenance personnel can immediately specify the noise source by viewing the variation of the beam diameter in FIGS. 15B to 15D, by recording which position the peak appears at, and by checking the environmental noise and the frequency correspondence.

Figure 16:
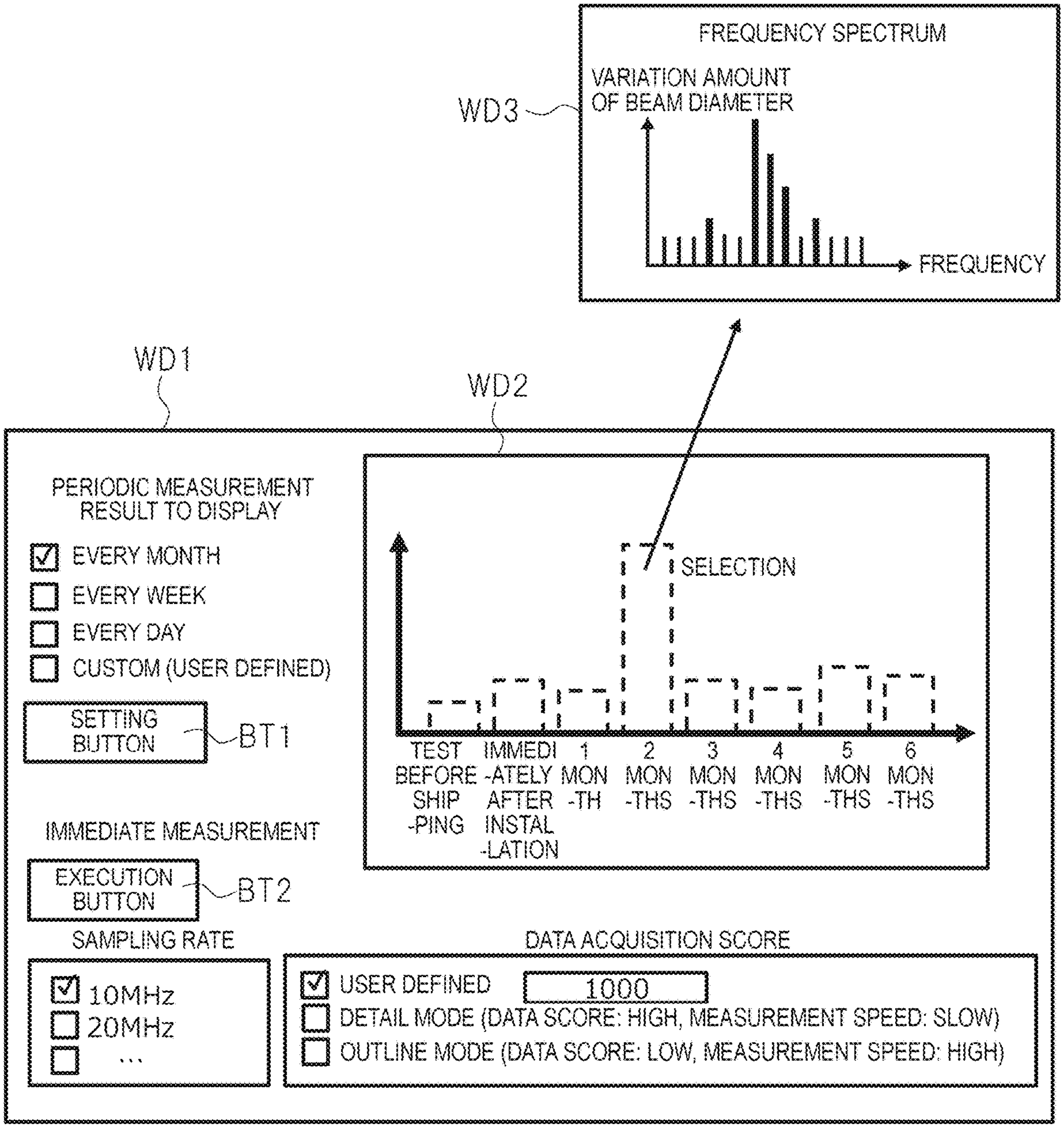
FIG. 16 is a schematic diagram illustrating a GUI in the fourth embodiment.

FIG. 16 is an example of the GUI displaying measurement results of a periodic variation of the beam diameter. As described with reference to FIGS. 15A to 15D, the variation of the beam diameter (frequency spectrum) are calculated for each certain period, and the results are stored in the recording device 8. The processor system 7 can display the frequency spectrum for each certain period stored in the recording device 8 on a window WD3 of the display device 9 as illustrated in FIG. 16.

Various items are displayed in a window WD1. At the upper left of the window WD1, check boxes are displayed for setting the intervals of the time axis data to once a month, once a week, every day, and arbitrarily (user defined). When the user checks any of the check boxes, a window WD2 illustrating the intensity of the variation of the beam diameter at each measurement timing is displayed on the upper right of the window WD1.

The measurement timing, the sampling rate, and the data acquisition score can be changed by the user pressing a setting button BT1 provided within the window WD1. When the user selects one of intensities of the variation of the beam diameter displayed in the window WD2, the frequency spectrum at that time is displayed as in a window WD3.

When the user desires to measure the noise immediately, the user sets the sampling rate and the data acquisition score, and presses an execution button BT2 for immediate measurement provided in the window WD1 to execute the calculation of the variation of the beam diameter, so that the frequency spectrum is displayed in the window WD3.

Note that the technique disclosed in the fourth embodiment can also be implemented in combination with the techniques disclosed in the second and third embodiments.

Fifth Embodiment

A charged particle beam apparatus 200 according to the fifth embodiment will be described below with reference to FIGS. 17 and 18. Note that, in the following description, differences from the first embodiment will be mainly described, and descriptions of configurations that overlap with the first embodiment will be omitted.

In the first embodiment, the SEM device is used as the charged particle beam apparatus 100, but a charged particle beam apparatus 200 in the fifth embodiment is a transmission electron microscope (TEM device). The charged particle beam apparatus 200 is equipped with a switching power source of 100 kHz or more.

Figure 17:
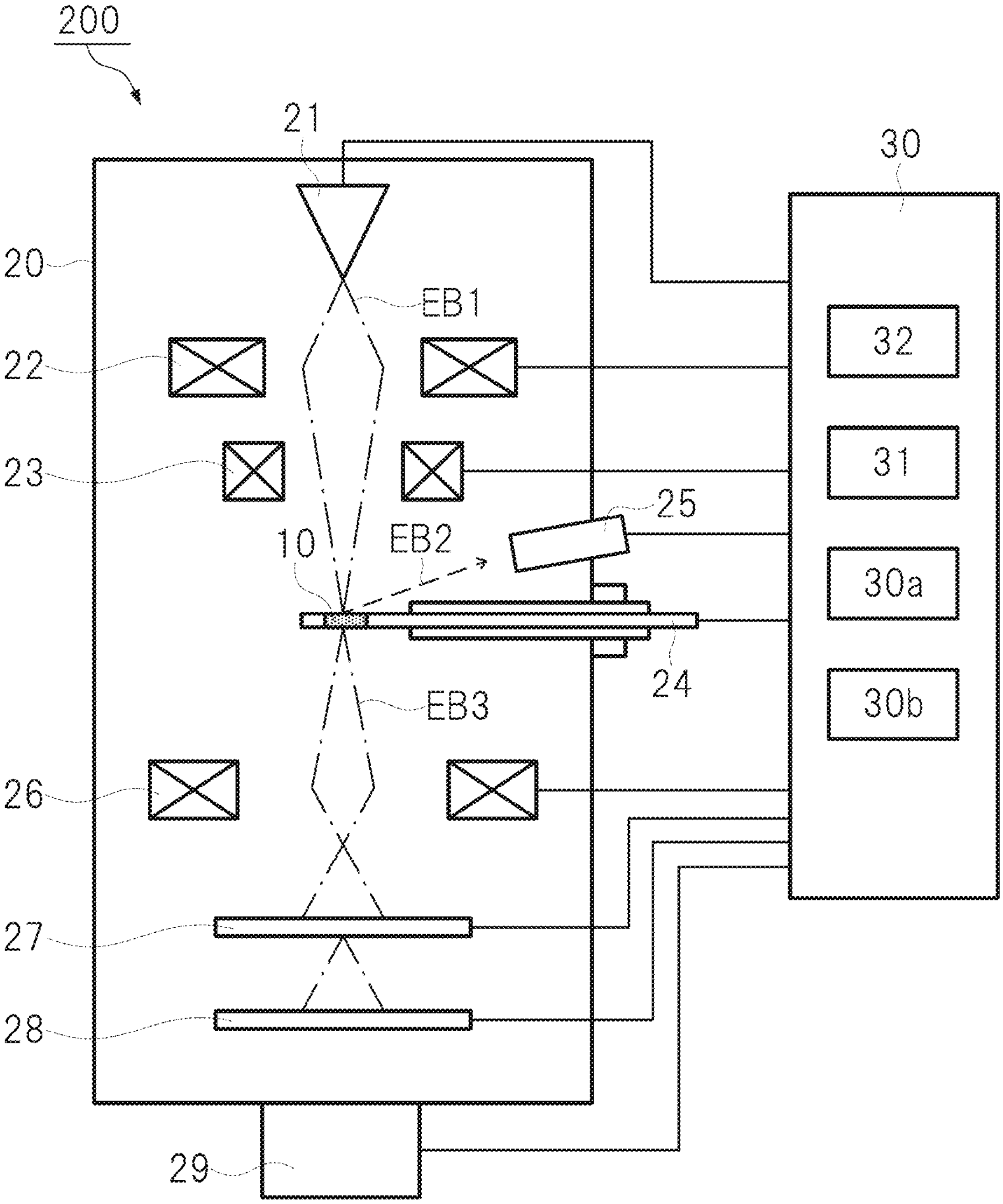
FIG. 17 is a schematic diagram illustrating a charged particle beam apparatus according to a fifth embodiment.

As illustrated in FIG. 17, the charged particle beam apparatus 200 includes a sample chamber 20, an electron source 21 for irradiating with an electron beam, an irradiation lens 22, a scanning coil 23, a stage 24, a detector 25 for secondary electrons, a lens 26, a ring-shaped detector 27, a detector 28, a camera 29, and a processor system 30. The processor system 30 includes a processor 30*a*, a converter 30*b*, a recording device 31, and a display device 32. Note that the electron source 21 is, for example, an electron gun. The scanning coil 23 is, for example, a magnetic field type deflector such as a coil having a core, but may be an electric field type deflector by using electrode plates.

The processor system 30 is electrically connected to the electron source 21, the irradiation lens 22, the scanning coil 23, the stage 24, the detector 25, the lens 26, the ring-shaped detector 27, the detector 28, and the camera 29 to control the operation. The processor 30*a*, the converter 30*b*, the recording device 31, and the display device 32 are similar to the processor 7*a*, the converter 7*b*, the recording device 8, and the display device 9 included in the processor system 7 of the charged particle beam apparatus 100.

The electron source 21 can irradiate with the electron beam EB1. The sample 10 is mounted on the sample holder attached to the tip of the stage 24. The scanning coil 23 is provided between the irradiation lens 22 and the lens 26, and the sample 10 is inserted below the scanning coil 23.

The electron beam EB1 emitted from an electron source 21 is converged on the sample 10 by the irradiation lens 22 and deflected by the scanning coil 23 to scan the sample 10. The detector 25 detects secondary electrons EB2 generated from the sample 10 by irradiation with the electron beam EB1. The processor system 7 can produce the photographed image from the detected secondary electrons EB2.

The ring-shaped detector 27 for dark-field image observation is arranged below the lens 26. The detector 28 for bright-field image observation, which can be moved in and out from the electron beam axis, is arranged below the ring-shaped detector 27. The camera 29 for transmission image observation is arranged below the detector 28.

By changing the conditions of the irradiation lens 22, the sample 10 is irradiated with the electron beam EB1 having a certain magnification, and transmission electrons EB3 transmitted through the sample 10 are imaged and magnified by the lens 26 and displayed on the camera 29.

The ring-shaped detector 27 detects electrons (scattered electrons) scattered at high angles from the sample 10 by irradiation with the electron beam EB1. The processor system 30 can produce the dark-field transmission electron image from the electrons detected by the ring-shaped detector 27. The detector 28 detects the transmission electrons EB3. The processor system 30 can produce the bright-field transmission electron image from the transmission electrons EB3 detected by the detector 28.

By changing a tilt angle of the sample 10 on the optical axis of the electron beam EB1, the transmission electron images (photographed images) of the sample 10 can be observed from various angles. Various data produced by the processor system 30 are stored in the recording device 31. The processor system 30 can display the analysis results stored in the recording device 31 on the display device 32 as necessary.

<Measurement of Variation of Beam Diameter of Electron Beam in Fifth Embodiment>

In the fifth embodiment, the noise source causing the variation of the beam diameter is specified by using the transmission electrons EB3 passing through the irradiation target instead of the secondary electrons EB2. Therefore, the secondary electron detection-related quantity, the control amount directly or indirectly applied to the deflector 3, and the secondary electron detection-related quantity described in the first embodiment can be replaced by the transmission electron detection-related quantity, the control amounted directly or indirectly applied to the scanning coil 23, and the transmission electron detection related quantity for description in the fifth embodiment, respectively.

The processor system 30 in the fifth embodiment performs the following operations (A) and (B).

(A) Acquires a first time-series change in transmission electron detection-related quantity by repeatedly performing the following (A1) and (A2).

(A1) Directly or indirectly, maintains or changes a control amount applied to the scanning coil 23 to a first control amount.

(A2) Acquiring the transmission electron detection-related quantity based on an output from the detector 28.

(B) Acquiring the time-series change in variation of the beam diameter of the charged particle beam (electron beam EB1) based on the first time-series change.

In the first embodiment, the secondary electron detection-related quantity is a secondary electron detection quantity, but in the fifth embodiment, the transmission electron detection-related quantity is a transmission electron detection quantity. The first control amount is a control amount corresponding to a position of a maximum value (including a local maximum value) of a line profile of the irradiation target.

More specifically, the processor system 30 can produce the photographed image and the luminance profile indicating the magnitude of the luminance for each coordinate of the photographed image according to the amount of the transmission electrons EB3 detected by the detector 28. In the fifth embodiment, the noise source causing the variation of the beam diameter is specified from the luminance profile based on the transmission electrons EB3.

Figure 18:
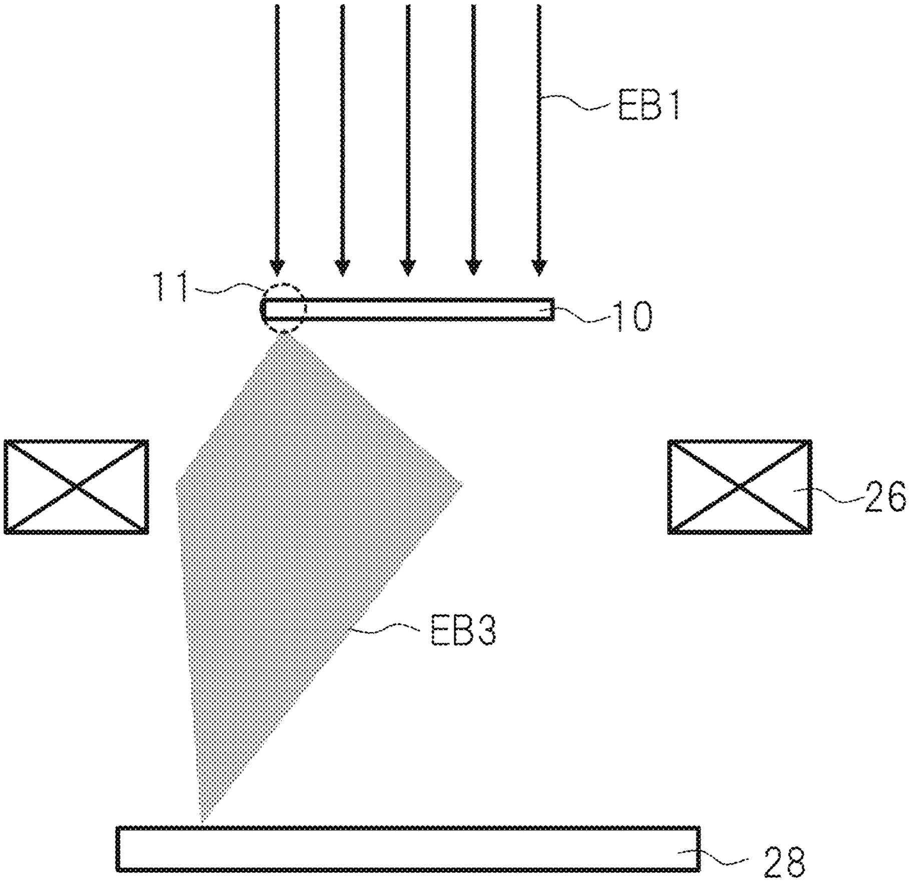
FIG. 18 is a schematic diagram illustrating a portion of the charged particle beam apparatus.

FIG. 18 is a schematic diagram illustrating an enlarged main unit of FIG. 17. In the charged particle beam apparatus 200, the electron beam EB1 is incident almost parallel to the sample 10, so that the local beam diameter cannot be defined on the sample 10. However, to obtain a clear image of the sample 10, the transmission electrons EB3 emitted backward from one point on the sample 10 is required be converged on one point on the detector 28. Therefore, considering the detector 28 and the vicinity thereof, the beam diameter and the variation of the beam diameter can be defined similarly to first embodiment.

First, the sample 10 is mounted on the stage 24. More specifically, the sample holder mounted on the stage 24 holds the sample 10. Next, the specific spot 11 on the sample 10 is continuously irradiated with the electron beam EB1 from the electron source 21. Herein, the processor system 30 produces the luminance profile similar to that illustrated in FIG. 7 and measures the variation of the maximum luminance in the luminance profile one by one. Accordingly, the processor system 30 calculates the time-series change in maximum luminance similar to that in FIG. 8. The time-series change in maximum luminance can be considered to be the time-series change in beam diameter of the electron beam EB1.

Next, by using frequency analysis such as fast Fourier transform (FFT), the processor system 30 calculates the frequency spectrum of the variation of the maximum luminance similar to that illustrated in FIG. 9 based on the time-series change in maximum luminance. The frequency spectrum can be considered to be the frequency spectrum related to the variation of the beam diameter of the electron beam EB1. The noise source is specified from the frequency of the large peak included in a frequency spectrum related to the variation of the beam diameter, and countermeasures are taken against the noise source.

As described above, also in the charged particle beam apparatus 200, the variation of the beam diameter of the electron beam EB1 can be measured from the variation of the maximum luminance, and the noise source causing the variation of the beam diameter can be specified.

Note that the technique disclosed in the fifth embodiment can also be performed in the same manner as the technique disclosed in FIG. 10 of the second embodiment. That is, the processor system 30 calculates the time-series change in luminance at the flat spot and calculates the frequency spectrum related to the variation of the luminance at the flat spot based on the time-series change by using the fast Fourier transform (FFT) or the like. The processor system 30 calculates the time-series change in luminance at the gradient spot and calculates the frequency spectrum of the variation of the luminance at the gradient spot based on the time-series change by using the fast Fourier transform (FFT) or the like.

By comparing the frequency spectra of the maximum luminance, the flat spot, and the gradient spot, the frequencies causing the variation of the beam, the frequencies causing the variation of the beam diameter, and the frequencies caused by the noise in the detection system can be specified. Note that the noise in the detection system in the fifth embodiment is noise that influences any component of the detector 28 and the processor system 30 and is noise that is detected even when there is not irradiation with the electron beam EB1.

The technique disclosed in the fifth embodiment can be performed in the same manner as the technique disclosed in FIGS. 11 to 14 of the third embodiment.

That is, as illustrated in FIG. 12, when the boundary BR includes the boundary BRa extending in the Y direction and the boundary BRb extending in a direction (herein, the X direction) different from the Y direction, the processor system 30 calculates the frequency spectrum of the boundary BRa and, after that, calculates the frequency spectrum of the boundary BRb. By sequentially measuring the boundaries BR extending in different directions, it is possible to specify in which direction the beam diameter is influenced by noise. Note that the region 2A is a region of the sample 10 having a difference in height from the region 1A or a region of the sample 10 made of a material different from that of the region 1A.

The technique disclosed in the fifth embodiment can be performed in the same manner as the technique disclosed in FIGS. 15A to 15D and 16 of the fourth embodiment.

That is, the variation of the beam diameter (frequency spectrum) calculated from the maximum luminance is performed for each certain period, and the results are stored in the recording device 8. The processor system 30 can display the frequency spectrum for each certain period stored in the recording device 8 on the window WD3 of the display device 9 as illustrated in FIG. 16.

Although the case where the charged particle beam apparatus 200 is a TEM device is illustrated herein, the charged particle beam apparatus 200 may be a low energy electron microscope (LEEM device) or a photoemission electron microscope (PEEM device).

<Variation>

Although the present invention has been specifically described above based on the above-described embodiments, the present invention is not limited thereto, and various modifications can be made without departing from the scope of the invention.

For example, a portion of the configuration of one embodiment can be replaced with the configuration of another embodiment. It is also possible to add the configuration of another embodiment to the configuration of one embodiment. Each of the configurations, functions, processing units, processing means, and the like described above may be realized by hardware by designing a portion or all of the configurations, functions, processing units, processing means, and the like, for example, with an integrated circuit. Each of the configurations and functions described above may be realized by software by the processor interpreting and executing the program realizing each function. Information of programs, tables, files, and the like realizing each function may be stored in a recording device such as a memory, a hard disk, or a solid state drive (SSD) or in a recording medium such as an IC card, an SD card, or a DVD.

Note that, in the above-described embodiment, it is possible to know how the beam diameter varies on the time axis. It is also possible to calculate that the beam diameter varies only in the specific direction, such as only the X direction or only the Y direction. For example, it is possible to know the variation when the beam is extended from a perfect circle to an ellipse, and it is also possible to know the variation when a perfect circle is enlarged or contracted.

The processor system has a model formula that can calculate the geometric length of the beam diameter or the geometric length of the variation width from at least the luminance or the output of the detector, so that the processor system can calculate the beam diameter itself or the geometric length of the variation amount.

With respect to the variation of the beam, it may be possible to detect the variation in all directions, or it may be possible to detect only the variation of the beam in the specific direction. The processor system has a model formula that can calculate an absolute amount or a variation width of the variation of the beam from the luminance or the output of the detector, so that the processor system can calculate the variation width of the variation of the beam in addition to the temporal change of the variation of the beam.

An ion beam may be used as the charged particle beam in addition to the electron beam described above. Here, an ion source (more specifically, an ion gun) is included in the charged particle beam apparatus as the charged particle source instead of an electron source. The irradiation shape of the charged particle beam may be a shape other than a circular shape and may be, for example, polygonal.

The sample 10 may be an article possessed by the user of the charged particle beam apparatus, may be an article brought by the maintenance personnel of the charged particle beam apparatus, or may be an article fixed to the stage. The article may be a dedicated article for acquiring the time-series change in variation of the beam diameter or variation of the beam, but it is not necessary. The boundary BR need not be perfectly straight and need not have vertical sides. The sample provided with a portion of which height changes in both the X and Y directions, such as a mortar shape or a mountain shape, may be used according to a known irradiation shape and intensity distribution of the electron beam EB1.

The technique disclosed above may be used for applications other than electrical noise measurement. For example, the technique disclosed above may be used to check the operation of the mechanical noise or the program running on the processor system or the operation of the component such as a stage.

The “maximum luminance” on the luminance profile for acquiring a variation of the diameter of the electron beam may be local maximum luminance. However, non-local maximum luminance is more preferable from a viewpoint that a greater change in luminance can be obtained. When the local maximum luminance is used, the local maximum luminance also includes the maximum luminance. Note that the luminance profile is information familiar to users of charged particle beam apparatus that are also used for estimating a cross-sectional shape or a material of the sample 10. Therefore, the luminance profile is preferred in terms of affinity.

Note that, in the above description, the luminance profile (and the line profile) is assumed to be acquired as the variation, but the luminance narrowed down to the luminance related to the spot of the luminance profile having a maximum luminance, the gradient spot, and the flat spot may be repeatedly acquired. Since only to the necessary spot is irradiated with the electron beam EB1, a variation can be obtained with a finer time granularity.

The variation or the variation described so far may be acquired without by using the line profiles. When focusing on acquisition of a time-series change in variation of the beam diameter, the electron beam EB1 may continue to be given the control amount (with respect to the deflector 3) to irradiate the boundary BR in FIG. 4 or 12. It is suitable when the position, shape, or material of the specific spot 11 of the sample 10 is known.

In other words, the following is acceptable. The first control amount applied to the deflector 3 is a control amount when the boundary BR of the irradiation target is irradiated with the electron beam EB1. The boundary BR is located between the regions 1A and 2A of the irradiation target. The region 1A is a portion of the sample 10, and the region 2A is a region of the sample 10 having a difference in height from the region 1A, a region of the sample 10 made of a material different from that of the region 1A, or a portion of the stage 5.

So far, luminance has been explained as an example of the secondary electron detection-related quantity, but when the luminance has a monotonically increasing relationship with the detected secondary electron detection quantity, a processed value of an output of the detector other than the luminance may be used.

What is claimed is:

1. A charged particle beam apparatus comprising:
- a charged particle source generating a charged particle beam;
- a deflector deflecting the charged particle beam;
- a detector detecting secondary electrons emitted from an irradiation target in response to irradiation with the charged particle beam; and
- a processor system, wherein
- the processor system
- (A) acquires a first time-series change in secondary electron detection-related quantity by repeatedly performing the following (A1) and (A2),
  - (A1) directly or indirectly maintains or changes a control amount applied to the deflector to a first control amount, and
  - (A2) acquires the secondary electron detection-related quantity based on an output from the detector, and
- (B) acquires a time-series change in variation of the beam diameter of the charged particle beam based on the first time-series change.

2. The charged particle beam apparatus according to claim 1, wherein
- a secondary electron detection-related quantity is a secondary electron detection quantity, and
- the first control amount is a control amount corresponding to a position of a maximum value including a local maximum value of a line profile of the irradiation target.

3. The charged particle beam apparatus according to claim 2, wherein
- as acquisition of (B), the processor system calculates a first frequency spectrum related to a variation of the maximum value based on the first time-series change, and
- the first frequency spectrum can be considered to be a frequency spectrum related to the variation of the beam diameter of the charged particle beam.

4. The charged particle beam apparatus according to claim 3, wherein
- the line profile includes
  - a maximum value spot that is the position of the maximum value,
  - a flat spot representing constant luminance, and
  - a gradient spot located between the maximum value spot and the flat spot and at which the secondary electron detection quantity continuously increases or decreases, and
- the processor system
- (C1) acquires a second time-series change in the secondary electron detection quantity at the flat spot, and
- (C2) calculates a second frequency spectrum related to the variation of the secondary electron detection quantity at the flat spot based on the second time-series change.

5. The charged particle beam apparatus according to claim 4, wherein the processor system
- (D1) calculates a third time-series change in the secondary electron detection quantity at the gradient spot, and
- (D2) calculates a third frequency spectrum related to the variation of the secondary electron detection quantity at the gradient spot based on the third time-series change.

6. The charged particle beam apparatus according to claim 5, wherein
- frequencies common to the first frequency spectrum, the second frequency spectrum, and the third frequency spectrum include frequencies caused by noise influencing any component of the detector and the processor system,
- frequencies common to the first frequency spectrum and the third frequency spectrum include frequencies causing the variation of the beam diameter of the charged particle beam, and
- frequencies existing only in the third frequency spectrum include frequencies causing the variation of the charged particle beam.

7. The charged particle beam apparatus according to claim 3, wherein
- the irradiation target is a sample or a combination of the sample and a stage,
- the line profile includes data about a first specific spot of the irradiation target,
- the first specific spot includes a first region, a second region adjacent to the first region, and a first boundary between the first region and the second region,
- the first region is a portion of the sample,
- the second region is a region of the sample that has a difference in height from the first region, a region of the sample that is made of a material different from that of the first region, or a portion of the stage, and
- the first boundary corresponds to a position of the maximum value in the line profile.

8. The charged particle beam apparatus according to claim 7, wherein
- the irradiation target includes a second specific spot including a third region, a fourth region, and a second boundary,
- the third region is a portion of the sample,
- the fourth region is a region of the sample having a difference in height with the third region, a region of the sample made of a material different from that of the third region, or a portion of the stage, in plan view, the second boundary is a boundary extending in a second extending direction different from a first extending direction of the first boundary, the first frequency spectrum indicates a variation of the beam diameter in a direction perpendicular to the first extending direction, and the processor system (E) repeatedly acquires an additional line profile for the second specific spot, (F) acquires a fourth time-series change in maximum value including a local maximum value from the additional line profile, and (G) calculates a fourth frequency spectrum related to the variation of the maximum value based on the fourth time-series change, and the fourth frequency spectrum indicates the variation of the beam diameter in a direction perpendicular to the second extending direction.

9. The charged particle beam apparatus according to claim 3, wherein the processor system includes a recording device and a display device, the calculated first frequency spectrum is stored in the recording device, and the processor system can calculate the first frequency spectrum for each certain period and display the first frequency spectrum for each certain period stored in the recording device on the display device.

10. The charged particle beam apparatus according to claim 1, wherein the irradiation target is a sample or a combination of the sample and a stage, a secondary electron detection-related quantity is a processed value of the output of the detector, the first control amount is a control amount when a boundary of the irradiation target is irradiated with the charged particle beam, the boundary is located between a first region and a second region of the irradiation target, the first region is a portion of the sample, and the second region is a region of the sample that has a difference in height with the first region, a region of the sample that is made of a material different from that of the first region, or a portion of the stage.

11. A charged particle beam apparatus comprising:

a charged particle source generating a charged particle beam;

a scanning coil deflecting the charged particle beam;

a detector detecting transmission electrons passing through an irradiation target in response to irradiation with the charged particle beam; and a processor system, wherein the processor system (A) acquires a first time-series change in transmission electron detection-related quantity by repeatedly performing the following (A1) and (A2), (A1) directly or indirectly, maintains or changes the control amount applied to the scanning coil to a first control amount, and (A2) acquires the transmission electron detection-related quantity based on an output from the detector, and (B) acquires a time-series change in variation of the beam diameter of the charged particle beam based on the first time-series change.

12. The charged particle beam apparatus according to claim 11, wherein the transmission electron detection-related quantity is a transmission electron detection quantity, and the first control amount is a control amount corresponding to a position of a maximum value including a local maximum value of a line profile of the irradiation target.

13. The charged particle beam apparatus according to claim 12, wherein as acquisition of (B), the processor system calculates a first frequency spectrum related to a variation of the maximum value based on the first time-series change, and the first frequency spectrum can be considered to be a frequency spectrum related to the variation of the beam diameter of the charged particle beam.

14. The charged particle beam apparatus according to claim 13, wherein the line profile includes a maximum value spot that is a position of the maximum value, a flat spot representing constant luminance, and a gradient spot located between the maximum value spot and the flat spot and at which the transmission electron detection quantity continuously increases or decreases, and the processor system (C1) acquires a second time-series change in the transmission electron detection quantity at the flat spot, and (C2) calculates a second frequency spectrum related to the variation of the transmission electron detection quantity at the flat spot based on the second time-series change.

15. The charged particle beam apparatus according to claim 14, wherein the processor system (D1) calculates a third time-series change in the transmission electron detection quantity at the gradient spot, and (D2) calculates the third frequency spectrum related to the variation of the transmission electron detection quantity at the gradient spot based on the third time-series change.

16. The charged particle beam apparatus according to claim 15, wherein frequencies common to the first frequency spectrum, the second frequency spectrum, and the third frequency spectrum include frequencies caused by noise influencing any component of the detector and the processor system, frequencies common to the first frequency spectrum and the third frequency spectrum include frequencies causing the variation of the beam diameter of the charged particle beam, and frequencies that are present only in the third frequency spectrum include frequencies causing the variation of the charged particle beam.

17. The charged particle beam apparatus according to claim 13, wherein the irradiation target is a sample or a combination of the sample and a stage, the line profile includes data about a first specific spot of the irradiation target, the first specific spot includes a first region, a second region adjacent to the first region, and a first boundary between the first region and the second region, the first region is a portion of the sample, the second region is a region of the sample that has a difference in height from the first region, a region of the sample that is made of a material different from that of the first region, or a portion of the stage, and the first boundary corresponds to a position of the maximum value in the line profile.

18. The charged particle beam apparatus according to claim 17, wherein the irradiation target includes a second specific spot including a third region, a fourth region, and a second boundary, the third region is a portion of the sample, the fourth region is a region of the sample having a difference in height with the third region, a region of the sample made of a material different from that of the third region, or a portion of the stage, in plan view, the second boundary is a boundary extending in a second extending direction different from a first extending direction of the first boundary, the first frequency spectrum indicates a variation of the beam diameter in a direction perpendicular to the first extending direction, the processor system (E) repeatedly acquires an additional line profile for the second specific spot, (F) acquires a fourth time-series change in maximum value including local maximum value from the additional line profile, and (G) calculates a fourth frequency spectrum related to the variation of the maximum value based on the fourth time-series change, and the fourth frequency spectrum indicates the variation of the beam diameter in a direction perpendicular to the second extending direction.

19. The charged particle beam apparatus according to claim 13, wherein the processor system includes a recording device and a display device, the calculated first frequency spectrum is stored in the recording device, and the processor system can calculate the first frequency spectrum for each certain period and display the first frequency spectrum for each certain period stored in the recording device on the display device.

20. The charged particle beam apparatus according to claim 11, wherein the irradiation target is a sample or a combination of the sample and a stage, the transmission electron detection-related quantity is a processed value of the output of the detector, the first control amount is a control amount when the boundary of the irradiation target is irradiated with the charged particle beam, the boundary is located between a first region and a second region of the irradiation target, the first region is a portion of the sample, and the second region is a region of the sample that has a difference in height with the first region, a region of the sample that is made of a material different from that of the first region, or a portion of the stage.

* * * * *